(12) United States Patent
Doi et al.

(10) Patent No.: US 6,316,391 B1
(45) Date of Patent: Nov. 13, 2001

(54) OXIDE SUPERCONDUCTING WIRE AND METHOD OF MANUFACTURING THE SAME

(75) Inventors: Toshiya Doi; Takesi Ozawa; Toyotaka Yuasa, all of Hitachi; Kazutoshi Higashiyama, Naka-gun, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/536,043

(22) Filed: Mar. 27, 2000

Related U.S. Application Data

(63) Continuation of application No. 08/530,775, filed on Sep. 19, 1995, now abandoned.

(30) Foreign Application Priority Data

Sep. 20, 1994 (JP) .................................................... 6-224745

(51) Int. Cl.$^7$ .............................. H01B 12/00; H01F 6/00; H01L 39/00
(52) U.S. Cl. ......................... 505/236; 505/211; 505/231
(58) Field of Search ............................. 505/211, 230–239

(56) References Cited

U.S. PATENT DOCUMENTS

| | | |
|---|---|---|
| 5,071,828 | 12/1991 | Greuter et al. . |
| 5,114,905 | 5/1992 | Giessen et al. . |
| 5,187,149 | 2/1993 | Jin et al. . |
| 5,741,377 | 4/1998 | Goyal et al. . |

(List continued on next page.)

FOREIGN PATENT DOCUMENTS

| | | |
|---|---|---|
| 3-93110 | 4/1991 | (JP) . |
| 7-192546 | 7/1995 | (JP) . |

OTHER PUBLICATIONS

S. Nagashima, Shyugo soshiki, Maruzen, Published in Japan on Jan. 20 1984, pp. 132–135, 184–187.

$7^{th}$ International Symposium on Superconductivity, Nov. 8–11, 1994, Kitakyushu,Japan, Program and Abstracts, "A New Type of Superconducting Wire: Biaxially Oriented $Tl_1(Ba_{0.8}Sr_{0.2})2CA_2CU_3O_9$ on $\{100\}<100>$ textured Silver Tape", p. 7, T.J. Doi, et al.

Jpn. J. Appl. Phys., vol. 33 (1994) pp. 5692–5696, Part 1, No. 10, Oct. 1994, Transport Critical Current Densities in Uniaxialy and Biaxially Oriented $T11(Ba_{0.8}Sr_{0.2})_2Ca_2Cu_3O_9$ Superconducting Films on Ag and SrTio3 Substrates Prepared by a Spray Pyrolysis Method, T. Doi et al.

(List continued on next page.)

Primary Examiner—Jeffrey Gaffin
Assistant Examiner—Jeremy Norris
(74) Attorney, Agent, or Firm—Kenyon & Kenyon

(57) ABSTRACT

The present invention provides superconductors capable of being used at temperatures to which the superconductor can be cooled in liquid nitrogen and of carrying current in a high critical current density in a magnetic field, and superconducting apparatuses employing the superconductors and more advantageous in costs than the conventional superconducting apparatuses. A superconducting wire is formed by combining a metallic body of a cubic aggregate structure and an oxide superconducting substance. The present invention provides superconductors, superconducting wires, superconducting magnets and applied superconducting apparatuses having a high superconducting critical current density. The applied super conducting apparatuses employing the superconductors or the superconducting wires in accordance with the present invention are able to operate when cooled in liquid nitrogen-and can be manufactured at costs lower than those of the conventional superconducting apparatuses.

25 Claims, 13 Drawing Sheets

U.S. PATENT DOCUMENTS 5,798,312 * 8/1998 Okada et al. .................. 505/230
6,226,858 * 5/2001 Matsumoto et al. .................. 29/599

OTHER PUBLICATIONS

Proceedings of the $7^{th}$ International Symposium on Superconductivity (ISS '94), Nov. 8–11, 1994, Kitakyushu, Advances in Superconductivity VI, A New Type of Superconducting Wire; Biaxially Oriented $Tl_1(Ba_{0.8}Sr_{0.2})_2CA_2CU_3O_9$ on {100} <100> textured Silver Tape, pp. 817–820, Toshiya J. Doi, et al.

Applied Physics Letters, vol. 65, No. 6, Aug. 8, 1994, "Transport superconducting properties of grain boundaires in $Tl_1Ba_2Ca_2Cu_3O_x$ thin films", pp. 776–778, T. Nabatame, et al.

Japanese Journal of Applied Physics, vol. 30, No. 6B, Jun., 1991, pp. L. 1096–L 1098, Biaxial Alignment of High–$T_c$ Superconductor polycrystals (III): Demonstration in a Bi–2212(Yb) Thick Film, Bao–shan Zhang, et al.

* cited by examiner

RATIO OF CRYSTALS HAVING FACES {100} PARALLEL TO THE SURFACE OF THE TAPE AND ORIENTATIONS <100> PARALLEL TO THE ROLLING DIRECTION

ENLARGED VIEW OF A HEXAGONAL PART AT MAGNIFICATION x 60

ENLARGED VIEW OF A HEXAGONAL PART AT MAGNIFICATION x 250

FINE MULTIWIRE CABLE (MAGNIFICATION x 60)

FINE MULTIWIRE CABLE (MAGNIFICATION × 60)

OXIDE SUPERCONDUCTING WIRE AND METHOD OF MANUFACTURING THE SAME

This is a continuation of U.S. patent application Ser. No. 08/530,775, filed Sep. 19, 1995, now abandoned which claims priority to Japanese Patent Application No. 6-224745 filed in Japan on Sep. 20, 1994. U.S. patent application Ser. No. 08/530,775 and Japanese Patent Application No. 6-224745 are incorporated by reference in their entirety.

BACKGROUND OF THE INVENTION

The present invention relates to a superconducting wire or a superconductor formed by combining an oxide superconducting substance that exhibits superconductivity when cooled to the freezing point of 63 K of liquid nitrogen and a metallic body with controlled crystal orientation, and capable of carrying currents in a high superconducting critical current density (Jc) in a magnetic field, and a method of manufacturing the same.

The present invention relates also to superconducting magnets, superconducting NMR apparatuses, superconducting MRI apparatuses, superconducting generators, superconducting energy storage devices, magnetic shielding devices, synchrotron radiation generators, magnetic separators and elementary particle accelerators employing the aforesaid superconducting wire or the superconductor and having economic advantages far greater than those of the conventional ones.

The present invention relates also to a silver tape having a cubic aggregate structure invented during the course of the development of a superconducting wire or a superconductor capable of carrying current in a high Jc, and a method of manufacturing the same.

Tens of oxide superconducting substances have been discovered since the first high-temperature oxide superconducting substance was discovered in 1986. Studies of the oxide superconducting substances of the following four systems, among those hitherto discovered, are being currently made for the practical application thereof owing to their stability and ease of composition.

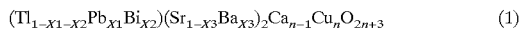
$$(Tl_{1-X1-X2}Pb_{X1}Bi_{X2})(Sr_{1-X3}Ba_{X3})_2Ca_{n-1}Cu_nO_{2n+3} \quad (1)$$

where:
  $0 \leq X1 \leq 0.9$
  $0 \leq X2 \leq 0.5$
  $0 \leq X1+X2 \leq 1$
  $0 \leq X3 \leq 1$
  n=1, 2, 3, 4 or 5
(these oxide superconducting substances will be designated as those of the Tl-1-layer system).

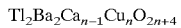
$$Tl_2Ba_2Ca_{n-1}Cu_nO_{2n+4} \quad (2)$$

where:
  n=1, 2, 3, 4 or 5
(these oxide superconducting substances will be designated as those of the Tl-2-layer system).

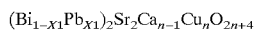
$$(Bi_{1-X1}Pb_{X1})_2Sr_2Ca_{n-1}Cu_nO_{2n+4} \quad (3)$$

where:
  $0 \leq X1 \leq 0.4$
  n=1, 2 or 3
(these oxide superconducting substances will be designated as those of the Bi-2-layer system).

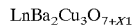
$$LnBa_2Cu_3O_{7+X1} \quad (4)$$

where:
  Ln is Y or a rare earth element
  $-0.5 \leq X1 \leq 0.1$
(these oxide superconducting substances will be designated as those of the Y system).

The substances of the Bi-2-layer system have crystals that can be easily oriented, have crystal boundaries that carry superconductive current smoothly and, therefore, are capable of carrying currents in a high superconductive transport current density (transport Jc) when any magnetic field is not applied thereto ("Japanese Journal of Applied Physics", Vol. 30, pp. L2083–L2084, 1991). The substances of the Bi-2-layer system have, owing to their intrinsic crystal structures, a fatal problem that their pinning forces are very weak at temperatures to which the substances can be cooled in liquid nitrogen ("Physica C", Vol. 177, pp. 431–437, 1991). Therefore, the substances of the Bi-2-layer system are suitable for forming superconducting wires having excellent characteristics to be used at temperatures below about 40 K, however, those substances could not have been used for forming superconducting wires to be used at temperatures of 60 K or above.

The substances of the Tl-1-layer system and the Tl-2-layer system maintain high pinning force at temperatures up to temperatures near their critical temperatures, however, their crystals are difficult to be oriented. Therefore, the crystal boundaries of those substances do not pass superconducting current smoothly, and superconducting wires of those substances having transport Jc exceeding 10,000 A/cm² in a magnetic field of 1 T at 77 K, which is regarded as a standard for practical application, have not been obtained ("Physica C", Vol. 220, pp. 310–322, 1994; "Hitachi Review", Vol. 39, p. 55, 1990; "Japanese Journal of Applied Physics", Vol. 27, pp. L185–L187, 1988).

Recently, many laboratories have made studies to obtain superconducting wires capable of carrying currents in a high Jc at 77 K in a magnetic field by orienting the crystals of substances of the Tl-1-layer system and the Y system that exert high pinning forces at 77 K. For example, Iijima, et al. published a method of making a superconducting substance of the Y system in "Proceedings of 5th International Symposium on Superconductivity", Nov. 16–19, 1992, Kobe, Japan, pp. 661–664. This method forms an yttria-stabilized zirconia layer of oriented crystals on a polycrystalline Ni-base alloy substrate by an Ion-beam-assisted deposition process, and then makes a superconducting substance of the Y system on the yttria-stabilized zirconia layer by a pulsed laser deposition process. Deluca, et al. published a method of making a superconducting substance of the Tl-1-layer system on a polycrystalline yttria-stabilized zirconia by spray pyrolysis in "Physica C", Vol. 205, pp. 21–31, 1993. Yoshino, et al. disclosed a method of manufacturing a superconductor of oriented crystals, using a silver tape of crystals having faces (1 0 0) or (1 1 0) aligned in parallel to the rolled surface in Japanese Patent Laid-open (Kokai) No. 3-9311. Yoshino, et al. published a method of making a superconducting substance of the Y system on a silver tape of silver crystals having faces (1 1 0) aligned in parallel to the surface of the silver tape by an ionized cluster beam deposition process in "Abstracts of 6th International Symposium on Superconductivity", Oct. 26–23, 1992, Hiroshima, Japan, p. 119.

So far, superconducting wires having practically acceptable performance characteristics at temperatures of or above the temperature to which the superconducting wires can be cooled in liquid nitrogen could not have been manufactured and there have been no superconducting apparatus capable of operation when cooled with a refrigerant having a boiling point higher than that of liquid helium, such as liquid nitrogen.

So far, any silver tapes of a cubic aggregate structure in which the faces {1 0 0} of the crystals are aligned with the orientations <1 0 0> have not been obtained (S. Nagashima, "Shyugo Soshiki", Maruzen)

PROBLEM TO BE SOLVED BY THE INVENTION

Prior art using superconducting substances of the Bi-2-layer system has a problem, owing to the weak pinning force at 77 K, that the critical current density drops sharply when a magnetic field is applied to the superconducting substance of the Bi-2-layer system at temperatures of 60 K or above, which has been a restrictive condition on the application of superconducting substances of the Bi-2-layer system to superconducting apparatuses that function when cooled in liquid nitrogen.

The technique proposed by Iijima, et al. uses the Ion-beam-assisted deposition process requiring a vacuum environment for making yttria-stabilized zirconia of orientated crystals. This process is expected to be economically very disadvantageous when manufacturing a long wire of, for example, 1 km. Therefore, it may be difficult to manufacture a long superconducting wire by the technique that forms an yttria-stabilized zirconia layer of oriented crystals on a Ni-base alloy substrate and forms a superconducting substance of the Y system on the yttria-stabilized zirconia layer.

It is expected to be very difficult to form a long yttria-stabilized zirconia, i.e., a ceramic, by the technique proposed by Deluca, et al. and hence it may be difficult to practically manufacture a long superconducting wire.

The technique proposed by Yoshino, et al. gives heed only to the alignment of the c-axis of the crystals of the superconducting substance and takes no measures to align the a-axis of the crystals. Consequently, the critical current density of the superconducting substance produced by this technique is as low as 10,000 A/cm$^2$ at 77 K.

The technique proposed by Yoshino, et al. forms silver crystals arranged with the faces (1 1 0) in parallel to the surface of the tape. The faces (0 0 1) of the crystals of a superconducting substance must be parallel to each other to obtain a high Jc. However, the faces (1 1 0) of silver crystals and the faces (0 0 1) of superconducting crystals do not match well with each other, the orientation of the superconducting crystal cannot be aligned satisfactory by the technique proposed by Yoshino, et al. and, consequently, the Jc at 77 K in a magnetic field of 0 T is 45,000 A/cm$^2$, which is not very large.

It has been difficult to manufacture a long superconducting wire practically by the techniques proposed by Iijima, et al., Deluca, et al. and Yoshino, et al. because these techniques do not take thoroughly into consideration the properties of the base material on which a superconducting substance is deposited.

Accordingly, it is an object of the present invention to provide a base material suitable for aligning the orientation of the crystals of an oxide superconducting substance and to provide a superconductor and a superconducting wire capable of carrying current in a high critical current density even in a magnetic field by combining such a base material and an oxide superconducting substance. Another object of the present invention is to provide applied apparatuses utilizing superconduction, including superconducting magnets, NMR apparatuses, MRI apparatuses, magnetically levitated trains, superconducting generators, energy storage devices, magnetic shielding devices, synchrotron radiation generators and elementary particle accelerators, which are made possible by employing a superconducting wire according to the present invention and are capable of operating at temperatures of or above the temperature to which the superconducting wires can be cooled in liquid nitrogen.

SUMMARY OF THE INVENTION

The object of the present invention can be achieved by a superconducting wire or a superconductor formed by combining an oxide superconducting substance and a metallic body having a cubic aggregate structure. The cubic aggregate structure is, as described in, for example, S. Nagashima, "Shyugo Soshiki", Maruzen, pp. 133 and 185, an aggregate structure of crystals having faces {1 0 0} and orientations <0 0 1>.

When faces {1 0 0} of the metallic crystals of a metallic body of a cubic aggregate structure are aligned with the interface between the metallic body and the oxide superconducting substance, the superconducting critical current density (Jc) of a superconductor formed by combining the metallic body and the oxide superconducting substance can be enhanced.

When the faces {1 0 0} of the metallic crystals of a metallic body of a cubic aggregate structure and the faces (0 0 1) of the crystals of an oxide superconducting substance are parallel to each other, the crystal grains of the oxide superconducting substance are easy to be orientated and the Jc can be enhanced. The term "parallel" used herein means a condition in which components are aligned at deflection angles of 10° or below. It was found through the measurement of the Jc of superconductors respectively having different angles between the face {1 0 0} of a metallic crystal and the interface and different angles between the face {1 0 0} of the metallic crystal and the face (0 0 1) of the oxide superconducting substance that the Jc is reduced by about 10% when the angles are 5° or above, and the Jc drops sharply when the angles are 10° or above.

The value of Jc reaches a maximum when all the crystallographic axes a, b and c of the metallic crystals of the metallic body of a cubic aggregate structure and all the crystallographic axes a, b and c of the oxide superconducting substance are parallel to each other. Although Jc can be increased to a certain extent by aligning only one of the crystallographic axes of the metallic crystals and the corresponding axis of the oxide superconducting substance, the Jc is not sufficiently large for practical application.

Silver tapes of a cubic texture in which 99% of the faces {1 0 0} of the crystals are parallel and the crystal directions <0 0 1> are aligned were made, an oxide superconducting substance was deposited in different degree of alignment of crystal directions on the silver tapes, respectively, to form superconductors, and the values of Jc of the superconductors were measured. It was found that the values of Jc of the superconductors are higher than those of Jc of the prior art superconducting wires or superconductors when the ratio of the metallic crystals having faces {1 0 0} deviating at angles of 10° or below from the faces (0 0 1) of the oxide superconducting substance to the total metallic crystals is not less than 60%, and the Jc decreases sharply when the ratio of the metallic crystals having faces {1 0 0} deviating at angles of 10° or below from the faces (0 0 1) of the oxide superconducting substance to the total metallic crystals decreases below 80%. Therefore, it is desirable that the ratio of the metallic crystals having faces {1 0 0} deviating at angles of 10° or below from the faces (0 0 1) of the oxide superconducting substance to the total metallic crystals is 80% or above. When the ratio of the metallic crystals having crystal directions <1 1 0> deviating at angles of 10° or below from the crystal directions [1 1 0] of the crystals of the oxide superconducting substance to the total metallic crystals is not less than 60%, the Jc of the superconductor is higher than that of the prior art superconducting wire or superconductor. When the ratio of the metallic crystals having crystal directions <1 1 0> deviating at angles of 10° or below from the crystal directions [1 1 0] of the crystals of the oxide superconducting substance to the total metallic crystals decreases below 80%, Jc decreases sharply. Therefore, it is desirable that the ratio of the metallic crystals having crystal directions <1 1 0> deviating at angles of 10° or below from the crystal directions [1 1 0] of the crystals of the oxide superconducting substance to the total metallic crystals is 80% or above. When the ratio of the metallic crystals having directions <1 0 0> deviating at angles of 10° or below from the crystal directions [1 0 0] of the crystals of the oxide superconducting substance to the total metallic crystals is not less than 60%, the Jc of the superconductor is higher than that of the prior art oxide superconducting wire or superconductor. However, when the ratio of the metallic crystals having directions <1 0 0> deviating at angles of 10° or below from the crystal directions [1 0 0] of the crystals of the oxide superconducting substance to the total metallic crystals decreases below 80%, the Jc decreases sharply. Therefore, it is desirable that the ratio of the metallic crystals having directions <1 0 0> deviating at angles of 10° or below from the crystal directions [1 0 0] of the crystals of the oxide superconducting substance to the total metallic crystals is 80% or above.

Silver tapes respectively having different ratios of crystals having faces {1 0 0} parallel to the surface of the tapes and crystal directions <1 1 0> aligned with the longitudinal direction of the tapes were made, a layer of an oxide superconducting substance was deposited carefully on each silver tape, and the dependence of Jc on the ratio was examined. It was found that the Jc decreases sharply when the ratio of the metallic crystals having faces {1 0 0} aligned with the crystal directions <1 1 0> to the total metallic crystals decreases below 80%.

The metal tape of a cubic aggregate structure may be formed of any element instead of silver, provided that the element does not spoil the properties of the oxide superconducting substance used in combination with the metal tape when the superconductor is heat-treated. Possible materials of metal tapes are pure silver, silver/gold alloys, silver/palladium alloys, silver/copper alloys and dispersion-strengthened alloys produced by dispersing an oxide, such as MgO, in a silver matrix. Metals of the FCC structure are preferable because those metals facilitate forming a cubic aggregate structure. However, metals of the BCC structure may be used provided that the metals are able to for a cubic aggregate structure. Metals of HCP structure are unable to form superconductors having satisfactory characteristics.

Naturally, the superconducting part of a superconducting wire must be capable of carrying current in a high superconducting critical current density to enable the superconducting wire to carry current in a high critical current density. The ratio between the superconducting substance and the nonsuperconducting substance is an important factor. The greater the ratio of the superconducting substance, the higher is the Jc of the superconducting wire. According to the present invention, a thinner metal tape is more desirable and a thicker superconducting substance layer is more desirable. However, there are limits to the thicknesses of the metal tape and the superconducting substance layer. From the viewpoint of economic effect, the metal tape must be made by rolling. Experiments proved that it is very difficult to make a metal tape of a thickness less than 5 $\mu$m by rolling. Since the crystals of the superconducting substance is aligned by the influence of the crystals of the base material, the crystals of a superconducting substance layer of a thickness exceeding 3 $\mu$m cannot be satisfactorily oriented. Accordingly, it is difficult to make a superconducting wire having the ratio S1/S2, where S1 is the sectional area of the metallic body in a section perpendicular to the longitudinal direction and S2 is the sectional area of the oxide superconducting substance in the same section, greater than 0.6. If the ratio S1/S2 is excessively small, the critical current density in the superconducting wire is excessively small. In view of economic effect, the ratio S1/S2 must be 0.01 at the smallest.

Although the metallic body is formed in the shape of a tape in most cases, the metallic body may be formed in any suitable shape, such as a linear shape or a tubular shape, to form a superconducting wire capable of carrying current in a high Jc.

The oxide superconducting substance to be used must have an irreversible magnetic field, i.e., a minimum magnetic field above which a finite resistance is produced, higher than a magnetic field necessary at temperatures equal to or higher than a temperature to which the superconducting wire can be cooled in liquid nitrogen. For example, superconducting substances composed by using Tl, Sr, Ca, Cu and O as base elements are preferable because those superconducting substances have high Tc and high irreversible magnetic field Hc*. These superconducting substances are highly flexible and the substitution of elements is very liable to take place at the sites of the crystals. More concretely, the compositions of such superconducting substances are represented by:

$(Tl_{X1}Pb_{X2}Bi_{X3}Hg_{X4}Cu_{X5})(Sr_{1-X6}Ba_{X6})_2Ca_{n-1}Cu_nO_{2n+3+X7}$; where $0 \leq X1 \leq 1.0$, $0 \leq X2 \leq 1.0$, $0 \leq X3 \leq 0.5$, $0 \leq X4 \leq 1.0$, $0 \leq X5 \leq 1.0$, $0.5 \leq X1+X2+X3+X4+X5 \leq 1$, $0 \leq X6 \leq 1$, $-0.5 \leq X7 \leq 0.5$, and n=1, 2, 3, 4 or 5. Oxide superconducting substances having compositions represented by $LnBa_2Cu_3O_{7+X1}$, where Ln is Y or a rare earth element, and $-0.5 \leq X1 \leq 0.1$, have each a high irreversible magnetic field and are preferable oxide superconducting substances. Although superconducting substances having compositions represented by $(Tl_{1-X1-X2-X3}Pb_{X1}Bi_{X2}Hg_{X3})_2(Sr_{1-X4}Ba_{X4})_2Ca_{n-1}Cu_nO_{2n+3+X5}$, where n=2, 3, 4, 5, or 6, $0 \leq X1 \leq 0.8$, $0 \leq X2 \leq 0.5$, $0 \leq X3 \leq 1.0$, $0 \leq X1+X2+X3 \leq 1$, $0 \leq X4 \leq 1$, and $-0.5 \leq X5 \leq 0.5$, have comparatively small irreversible magnetic fields as compared with those of the superconducting substances of the Tl-1-layer system or the Y system, these substances may be used.

Since superconducting substances having compositions represented by $(Bi_{1-X1}Pb_{X1})_2Sr_2Ca_{n-1}Cu_nO_{2n+4}$, where $0 \leq X1 \leq 0.4$, and n=1, 2 or 3, have not very high irreversible magnetic fields at temperatures to which the superconductor can be cooled in liquid nitrogen and hence are not very suitable for use in the present invention. However, the Jc in a magnetic field equal to or lower than the irreversible magnetic field can be increased when these superconducting substances are used in combination with a metallic body of a cubic aggregate structure and, when used at lower temperatures, for example, at temperatures to which the superconductor can be cooled in liquid helium, the Jc can be increased greatly.

The present invention is applicable also to all the substances the characteristics of which can be improved by aligning the orientations of the crystals other than the superconducting substances mentioned above.

Since all the conventional superconducting apparatuses use superconducting substances that become superconductive only at temperatures of 30 K or below, those superconducting apparatuses needs liquid helium for operation and hence needs very high running costs. To solve such a problem, the present invention uses superconducting wires or superconductors formed by using substances that become superconductive when cooled in liquid nitrogen and, consequently, the cooling cost can be reduced remarkably. Applied superconducting apparatuses using superconducting wires or superconductors in accordance with the present invention reduce problems attributable to quenching which must be taken into consideration in manufacturing conventional superconducting apparatuses, i.e., a phenomenon that, when part of the superconductor went a normal conducting state by some reason, the normal conducting state propagates rapidly and the entire superconductor goes normal conducting state suddenly generating a large quantity of heat, and there is substantially no possibility that quenching occurs in those superconducting apparatuses. Therefore, the superconducting apparatuses using superconducting wires or superconductors in accordance with the present invention need not be provided with any measured to prevent quenching and hence the costs thereof is very low.

The most preferable substance for forming a metallic body of a cubic texture in accordance with the present invention to be applied to practical products is silver. However, polycrystalline silver having a cubic texture could not have been available so far. The inventors of the present invention examined the purity, draft, rolling temperature, and time and temperature for heat treatment of silver and have obtained silver of a cubic texture. More concretely, silver of a cubic texture can be obtained by drawing or rolling silver of a purity of 99.0% or above at temperatures in the range of 100 to 300° C., preferably, 150 to 200° C. at a draft of 80% or above to obtain a silver wire, and then subjecting the drawn or rolled silver to heat treatment at a temperature of 400° C. or above for 5 min or longer. This processed silver of a cubic texture is used in combination with an oxide superconducting substance. Having no anisotropy, lead wires or the like formed of this processed silver is superior to conventional silver wires in current and signal transmitting characteristics. The characteristics and performance of a GaAs semiconductor device formed on a substrate of this processed silver were equal to those of a GaAs semiconductor device formed on a GaAs single-crystal substrate, from which it is known that substrates of the silver of a cubic texture in accordance with the present invention is less expensive than GaAs single-crystal substrates. When a substrate of some substance having aligned crystal directions is necessary, a substrate of silver of a cubic texture in accordance with the present invention having a large area can be formed at a reduced cost.

DETAILED DESCRIPTION OF THE PRESENTLY PREFERRED EMBODIMENTS

Figure 1:
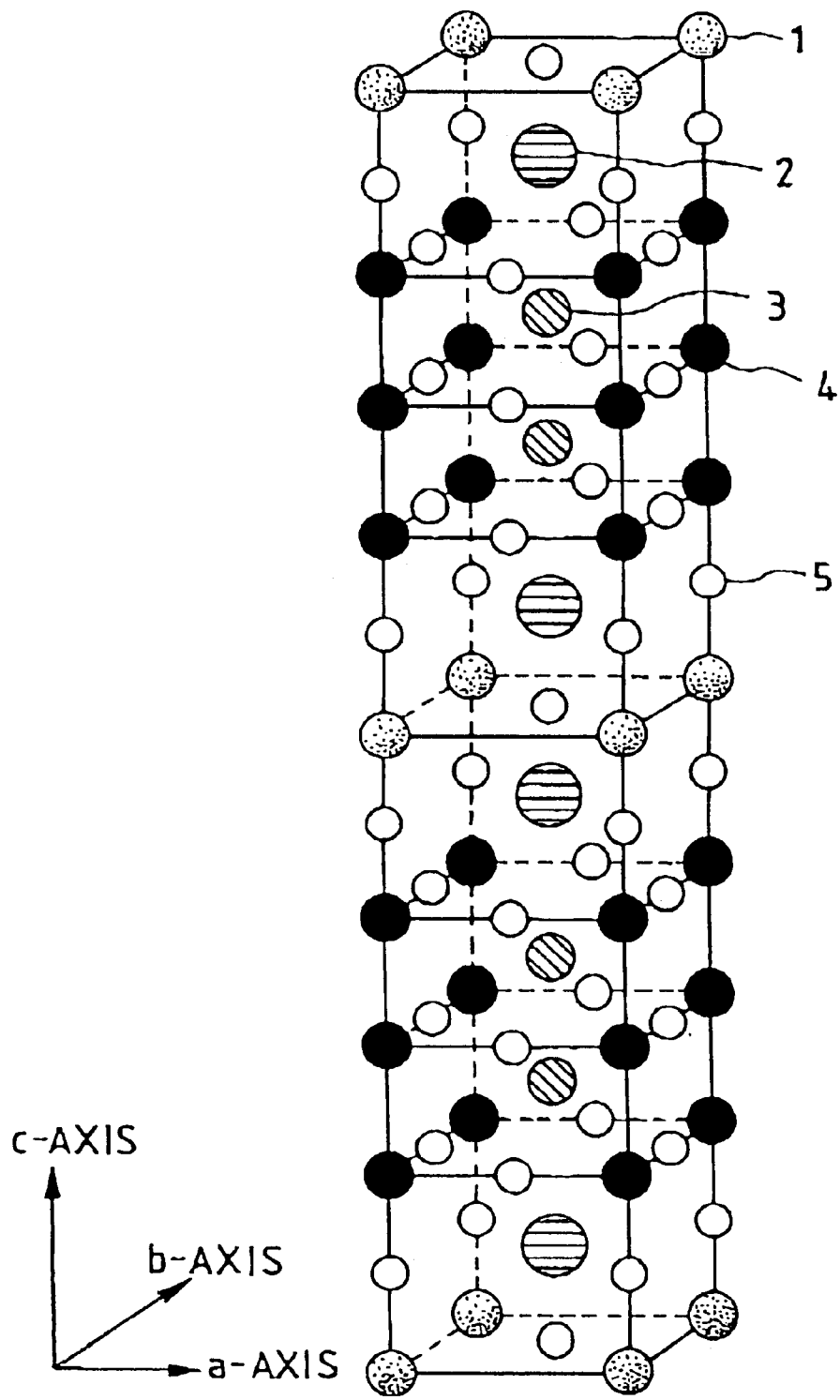
FIG. 1 is a typical view of the crystal structure of a superconducting substance.
Figure 2:
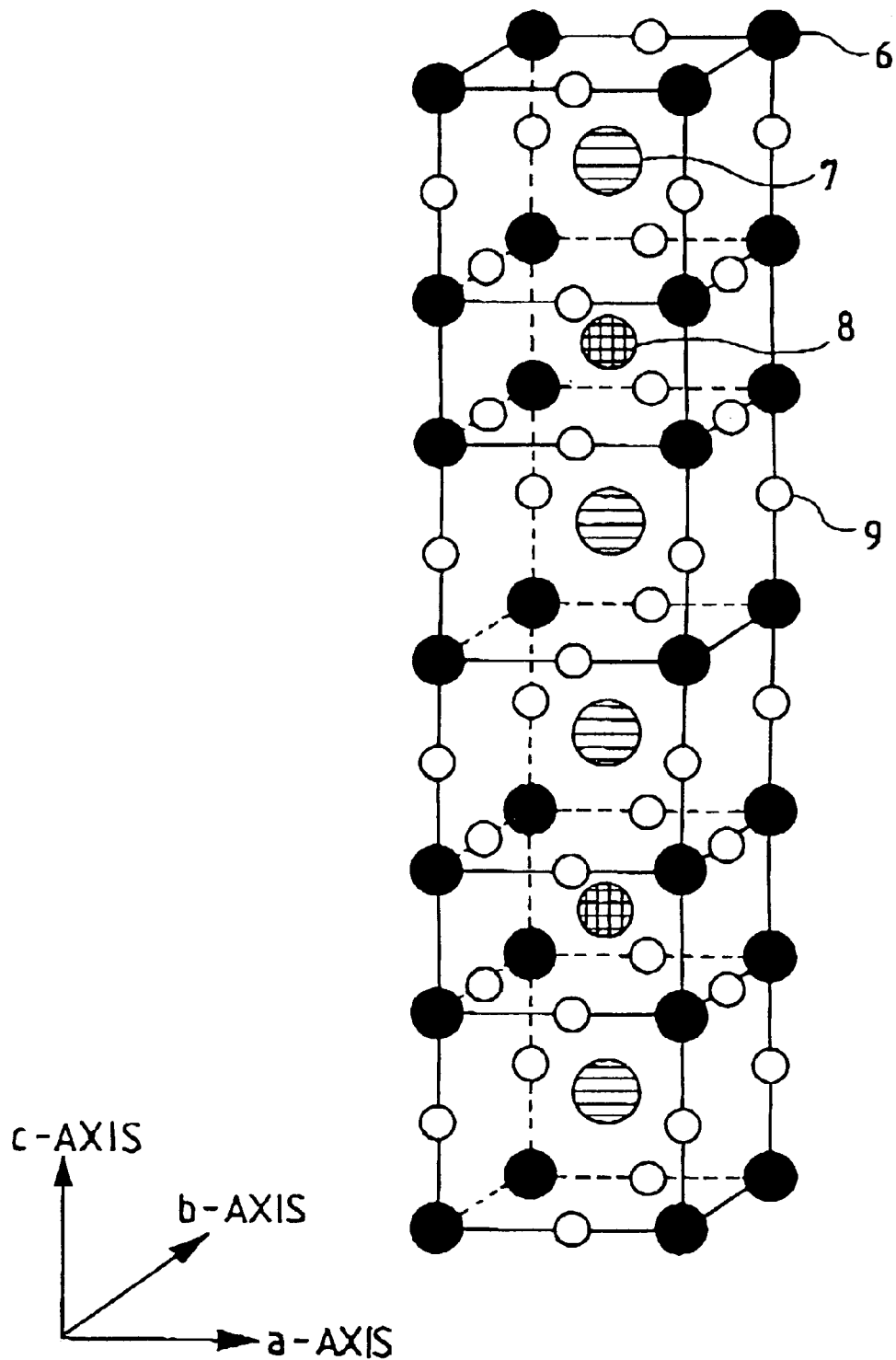
FIG. 2 is a typical view of the crystal structure of a superconducting substance of the Tl-2-layer system.
Figure 3:
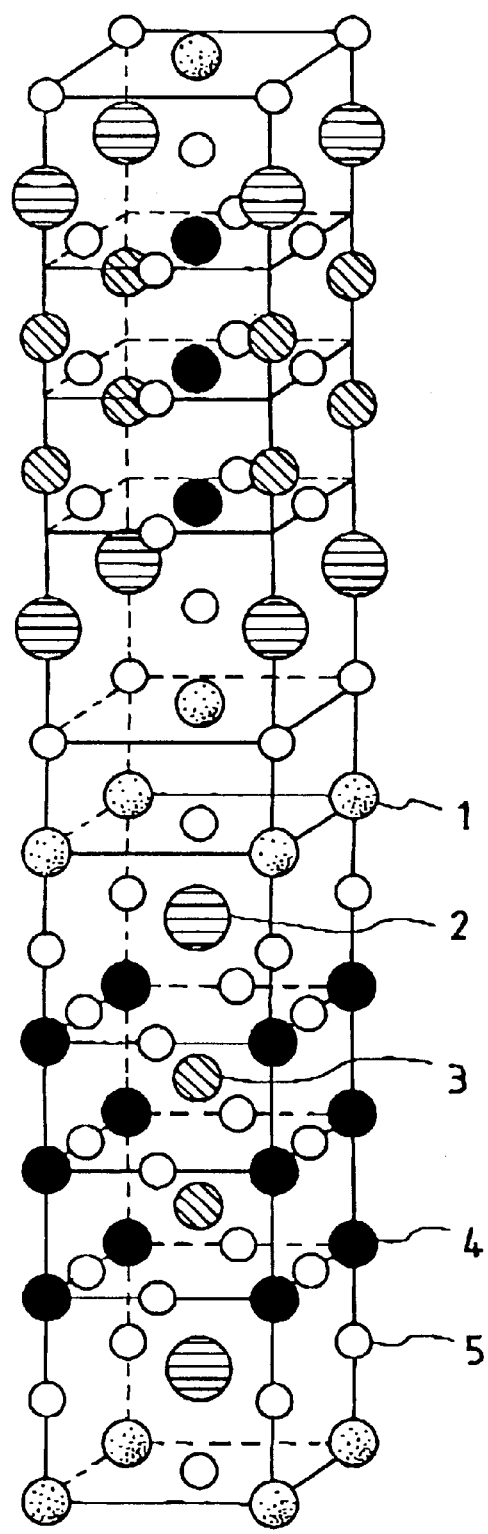
FIG. 3 is a typical view of the crystal structure of a superconducting substance.

The present invention shows that superconducting substances having crystal structures as shown in FIGS. 1, 2 and 3 (each of FIGS. 1 and 2 shows two unit lattices and FIG. 3 shows one unit lattice) are able to have high irreversible magnetic fields, i.e., an upper limit applied magnetic field below which a superconducting current can flow through a substance having no electrical resistance at a certain temperature, and a resistance is produced in the substance when a magnetic field higher than the irreversible magnetic field is applied to the substance, and provides a method of making a superconductor having a high irreversible magnetic field by introducing pinning center into the superconducting substance. It was found through studies that, when making a superconducting wire by using a polycrystalline superconducting substance, i.e., superconducting substance having crystal boundaries, capable of enhancing the irreversible magnetic field, the superconductor has a large Jc when the c-axes of the crystals of the superconducting substance are aligned (c-axis orientation) and that the superconductor has a further large Jc when the a-, b- and c-axes of the crystals of the superconducting substance are aligned (triaxial orientation). Then, the invention of a structure for a superconducting wire or a superconductor having a large Jc and a method of manufacturing the same was made possible by orienting the crystals of a superconducting substance capable of having a high irreversible magnetic field.

When layers of superconducting substances of the Y system, the Tl-1-layer system and the Tl-2-layer system are formed on ordinary commercial silver tapes, the crystals of the oxide superconducting substances are not aligned satisfactorily and the values of Jc are as low as several thousands amperes per square centimeter at 77 K in a magnetic field of 1 T. When layers of superconducting substances of the Y. system, the Tl-1-layer system and the Tl-2-layer system are formed on silver tapes of crystals with faces {1 1 0} aligned with the surface of the tape, the crystals of the oxide superconducting substances are not aligned satisfactorily and the values of Jc are as low as tens of thousands amperes per square centimeter at 77 K when no magnetic field is applied thereto, and as low as thousands amperes per square centimeter at 77 K in a magnetic field of 1 T. When layers of superconducting substances of the Y system, the Tl-1-layer system and the Tl-2-layer system are formed on silver tapes of crystals with faces {1 1 0} aligned with the surface of the tape and with the orientations <1 0 0> of the crystal not aligned, the crystals of the oxide superconducting substances are not aligned satisfactorily and the values of Jc are as low as tens of thousands amperes per square centimeter at 77 K when no magnetic field is applied thereto, and as low as thousands amperes per square centimeter at 77 K in a magnetic field of 1 T. When layers of oxide superconducting substances were formed on silver tapes of a cubic aggregate structure, values of Jc were as large as 10,000 A/cm2 or above at 77 K in a magnetic field of 1 T, which is inferred to be due to the arrangement of silver atoms in the surface of the silver tapes of a cubic aggregate structure suitable for the triaxial orientation, which is an ideal crystal orientation of the superconducting substance.

When layers of oxide superconducting substances were formed on tapes of a cubic aggregate structure of a silver/gold alloy, a silver/palladium alloy, a silver/copper alloy, a dispersion-strengthened alloy produced by dispersing MgO in a silver matrix and a dispersion-strengthened alloy produced by dispersing an intermetallic compound in a silver matrix, the values of Jc were as large as those of Jc of the composite structures formed by forming layers of the oxide superconducting substances on the silver tape of a cubic aggregate structure. It is expected that the values of Jc of composite structures formed by forming layers of oxide superconducting substances on tapes of a cubic aggregate structure of Ni, Ni/Fe alloys, Cu and Cu/Al alloys are as large as those of Jc of the composite structures formed by forming layers of the oxide asuperconducting substances on the silver tape of a cubic aggregate structure.

The compositions of superconducting substances, nonsuperconducting substances and other substances described herein are examples only and are not limitative. Actually, the compositions of those substances are indefinite, and the contents of the component elements may vary in the range of ten and odd percent to about 30%. Therefore, substances of compositions slightly different from compositions described herein are to be considered to be equivalent to the substances in accordance with the present invention provided that the crystal structures thereof are basically the same as those of the substances in accordance with the present invention.

Superconducting magnets having satisfactory characteristics and capable of operating when cooled in liquid nitrogen can be made by using superconductors in accordance with the present invention, and these superconducting magnets enables the manufacture of superconducting apparatuses capable of operating when cooled in liquid nitrogen including NMR apparatuses, SQUID apparatuses, MRI apparatuses and magnetically levitated trains. The superconducting magnets of all the apparatuses employing the superconducting. magnets can be substituted by the superconducting magnets employing the wires of the superconductors of the present invention, and the use of the superconducting magnets in accordance with the present invention enables those apparatuses to operate when cooled in liquid nitrogen. The use of liquid nitrogen, which is less expensive than liquid helium, for cooling curtails costs necessary for securing high reliability of the superconducting apparatuses, i.e., costs necessary for suppressing quenching that nullifies superconductivity suddenly, costs of refrigeration and costs of heat insulation greatly, as well as the running costs. Thus, the use of superconducting wires and coils in accordance with the present invention on superconducting apparatuses reduces the costs of the superconducting apparatuses greatly.

Preferred embodiments of the present invention will be described hereinafter.

EXAMPLE 1

A silver tape of a cubic aggregate structure was made. A commercial 99.99% purity silver ingot of 10 mm in width, 5 mm in thickness and 50 mm in length was rolled five times at 220° C. to obtain a 0.05 mm thick silver tape. This rolling process must not include any annealing process. The silver tape was annealed at 800° C. for two hours to obtain a silver tape as a substrate. The examination of the silver tape for crystal orientation by X-ray diffraction proved that about 80% of the faces {1 0 0} of the crystal grains were parallel to the surface of the silver tape substrate and the orientations <1 0 0> of the crystal grains were aligned with the rolling direction.

Figure 4:
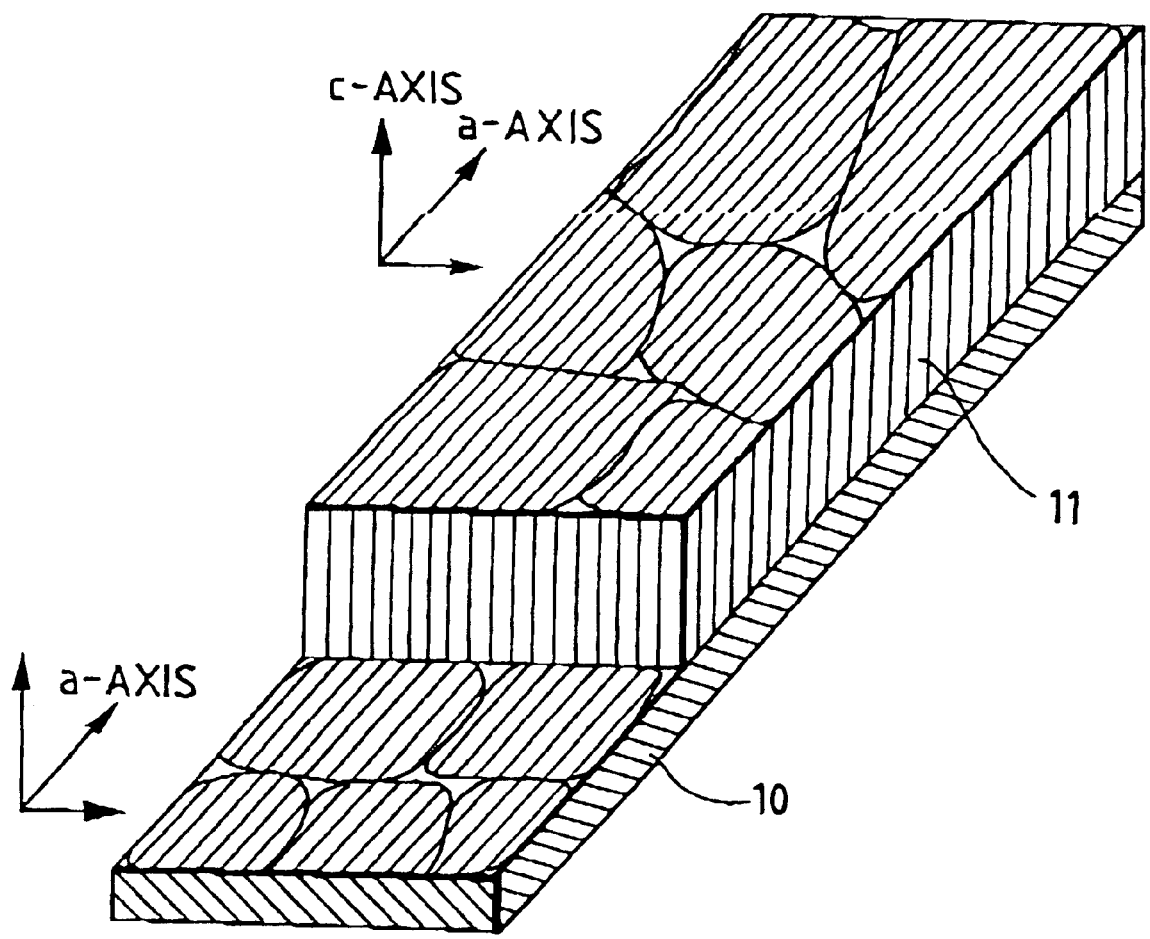
FIG. 4 is a typical perspective view of a superconducting wire in accordance with the present invention.

A layer of a superconducting substance was formed on the silver tape. A source solution was prepared by dissolving 0.01 mol of thallium nitrate of a purity of 98% or above, 0.02 mol of barium nitrate, 0.02 mol of calcium nitrate, 0.03 mol of copper nitrate and 0.05 mol of glycine in one litter of distilled water. The source solution was atomized in droplets of several micrometers in diameter with ultrasonic vibrators and the droplets of the source solution were sprayed on the silver tape substrate heated at 800° C. to deposit a precursor in a 3 $\mu$m thick layer. The layer of the precursor was annealed at 850° C. for 50 hr in an environment of a mixture of oxygen gas and $Tl_2O$ vapor to form a layer of a superconducting substance. FIG. 4 illustrates the construction of a superconductor thus formed, in which indicated at 10 is the silver tape substrate of a cubic aggregate structure and at 11 is the-layer of the oxide superconducting substance.

The resistivity of the superconductor was measured by a dc four-probe resistivity measuring method to determine the superconducting critical temperature.

The electrical resistance of the superconductor was zero at 107 K. The measured critical current density of the superconductor at 77 K was 500,000 A/cm$^2$ when no magnetic field was applied thereto and was 80,000 A/cm$^2$ when a magnetic field of 1 T perpendicular to the surface of the substrate was applied thereto.

The orientations of the c-axes of the crystals of the superconducting substance were measured by X-ray diffraction. The c-axes of 80% of the crystals were aligned with a normal to the surface of the substrate with deflection angles of 1° or below. The a-axes (or the b-axes) of not less than 80% of the crystals of the superconducting substance were aligned with the rolling direction of the silver tape.

COMPARATIVE EXAMPLE 1

The same commercial silver ingot as that used in Example 1 was rolled five times at a room temperature in a 0.05 mm thick silver tape, and the silver tape was annealed at 800° C. for 5 hr to obtain a silver tape as a substrate. The examination of the orientations of the crystals by X-ray diffraction showed that the faces {1 0 0} were parallel to the surface of the silver tape. A layer of a superconducting substance was formed on the silver tape by the entirely same process as that employed in Example 1 to obtain a superconductor. The resistivity of the superconductor was measured by a dc four-probe resistivity measuring method to determine the superconducting critical temperature. The electrical resistance of the superconductor was zero at 107 K. The measured critical current density of the superconductor at 77 K was 48,000 A/cm$^2$ when no magnetic field was applied thereto and was 5,000 A/cm$^2$ when a magnetic field of 1 T perpendicular to the surface of the substrate was applied thereto.

The orientations of the c-axes of the crystals of the superconducting substance were measured by X-ray diffraction. The c-axes of 80% of the crystals were aligned with a normal to the surface of the substrate with deflection angles of 5 or below. However, the orientations of the a-axes (or the b-axes) of the crystals of the superconducting substance were not particularly aligned.

COMPARATIVE EXAMPLE 2

A layer of a superconducting substance was formed on the same commercial silver ingot as that used in Example 1 by the same process as that employed in Example 1 to obtain a superconductor. The resistivity of the superconductor was measured by a dc four-probe resistivity measuring method to determine the superconducting critical temperature. The electrical resistance of the superconductor was zero at 107 K. The measured critical current density of the superconductor at 77 K was 35,000 A/cm$^2$ when no magnetic field was applied thereto and was 1,000 A/cm$^2$ when a magnetic field of 1 T perpendicular to the surface of the substrate was applied thereto.

The orientations of the c-axes of the crystals of the superconducting substance were measured by X-ray diffraction. The c-axes of 80% of the crystals were aligned with a normal to the surface of the substrate with deflection angles of 5° or below. However, the orientations of the a-axes (or the b-axes) of the crystals of the superconducting substance were not particularly aligned.

It is known from the comparative examination of the properties of the superconductors in Example 1 and Comparative examples 1 and 2 that a superconductor or a superconducting wire formed by combining a metallic body of a cubic aggregate structure and an oxide superconducting substance has a very large value of Jc.

EXAMPLE 2

A layer of a superconducting substance was formed on the silver tape of a cubic aggregate structure employed in Example 1. A source solution was prepared by dissolving 0.005 mol of thallium nitrate of a purity of 98% or above, 0.005 mol of lead nitrate, 0.02 mol of strontium nitrate, 0.02 mol of calcium nitrate, 0.03 mol of copper nitrate and 0.04 mol of glycine in one litter of distilled water. The source solution was atomized in droplets of several micrometers in diameter with ultrasonic vibrators and the droplets of the source solution were sprayed on the silver tape substrate heated at 800° C. to deposit a precursor in a 3 μm thick layer. The layer of the precursor was annealed at 860° C. for 50 hr in an environment of a mixture of oxygen gas and Tl$_2$O vapor to complete a superconductor.

The resistivity of the superconductor was measured by a dc four-probe resistivity measuring method to determine the superconducting critical temperature. The electrical resistance of the superconductor was zero at 121 K. The measured critical current density of the superconductor at 77 K was 800,000 A/cm$^2$ when no magnetic field was applied thereto and was 100,000 A/cm$^2$ when a magnetic field of 1 T perpendicular to the surface of the substrate was applied thereto.

The orientations of the c-axes of the-crystals of the superconducting substance were measured by X-ray diffraction. The c-axes of 80% of the crystals were aligned with a normal to the surface of the substrate with deflection angles of 1° or below. The a-axes (or the b-axes) of not less than 80% of the crystals of the superconducting substance were aligned with the rolling direction of the silver tape.

COMPARATIVE EXAMPLE 3

The same commercial silver ingot as that used in Example 1 was rolled five times at 20° C. in a 0.05 mm thick silver tape, and the silver tape was annealed at 800° C. for two hours to obtain a silver tape as a substrate. A layer of a superconducting substance was formed on the silver tape substrate by the same process as that employed in Example 2 to obtain a superconductor. The resistivity of the superconductor was measured by a dc four-probe resistivity measuring method to determine the superconducting critical temperature. The electrical resistance of the superconductor was zero at 121 K. The measured critical current density of the superconductor at 77 K was 30,000 A/cm$^2$ when no magnetic field was applied thereto and was 2,000 A/cm$^2$ when a magnetic field of 1 T perpendicular to the surface of the substrate was applied thereto.

The examination of the orientations of the c-axes of the crystals by X-ray diffraction showed that the c-axes of 80% of the crystals were aligned with a normal to the surface of the substrate at deflection angles of 5° or below. However, the orientations of the a-axes (or the b-axes) of the crystals of the superconducting substance were not particularly aligned.

COMPARATIVE EXAMPLE 4

A layer of a superconducting substance was formed on the same commercial silver ingot as that used in Example 1 by the same process as that employed in Example 2 to obtain a superconductor. The resistivity of the superconductor was measured by a dc four-probe resistivity measuring method to determine the superconducting critical temperature. The electrical resistance of the superconductor was zero at 121 K. The measured critical current density of the superconductor at 77 K was 25,000 A/cm$^2$ when no magnetic field was applied thereto and was 1,000 A/cm$^2$ when a magnetic field of 1 T perpendicular to the surface of the substrate was applied thereto.

The orientations of the c-axes of the crystals of the superconducting substance were measured by X-ray diffraction. The c-axes of 80% of the crystals were aligned with a normal to the surface of the substrate with deflection angles of 5° or below. However, the orientations of the a-axes (or the b-axes) of the crystals of the superconducting substance were not particularly aligned.

It is known from the comparative examination of the properties of the superconductors in Example 2 and Comparative examples 3 and 4 that a superconductor or a superconducting wire formed by combining a metallic body of a cubic aggregate structure and an oxide superconducting substance has a very large value of Jc.

EXAMPLE 3

A layer of a superconducting substance was formed on the silver tape of a cubic aggregate structure employed in Example 1. A source solution was prepared by dissolving 0.01 mol of yttrium nitrate of a purity of 98% or above, 0.02 mol of barium nitrate, 0.03 mol of copper nitrate and 0.02 mol of glycine in one litter of distilled water. The source solution was atomized in droplets of several micrometers in diameter with ultrasonic vibrators and the droplets of the source solution were sprayed on the silver tape heated at 800° C. to deposit a precursor in a 3 $\mu$m thick layer. The layer of the precursor was annealed at 870° C. for 50 hr in an environment of oxygen gas to complete a superconductor.

The resistivity of the superconductor was measured by a dc four-probe resistivity measuring method to determine the superconducting critical temperature. The electrical resistance of the superconductor was zero at 92 K. The measured critical current density of the superconductor at 77 K was 400,000 A/cm$^2$ when no magnetic field was applied thereto and was 80,000 A/cm$^2$ when a magnetic field of 1 T perpendicular to the surface of the substrate was applied thereto.

The orientations of the c-axes of the crystals of the superconducting substance were measured by X-ray diffraction. The c-axes of 80% of the crystals were aligned with a normal to the surface of the substrate with deflection angles of 1° or below. The a-axes (or the b-axes) of not less than 80% of the crystals of the superconducting substance were aligned with the rolling direction of the silver tape.

COMPARATIVE EXAMPLE 5

The same commercial silver ingot as that used in Example 1 was rolled five times at 20° C. in a 0.05 mm thick silver tape, and the silver tape was annealed at 800° C. for two hours to obtain a silver tape as a substrate. A layer of a superconducting substance was formed on the silver tape substrate by the same process as that employed in Example 3 to obtain a superconductor. The resistivity of the superconductor was measured by a dc four-probe resistivity measuring method to determine the superconducting critical temperature. The electrical resistance of the superconductor was zero at 83 K. The measured critical current density of the superconductor at 77 K was 10,000 A/cm$^2$ when no magnetic field was applied thereto and was 800 A/cm$^2$ when a magnetic field of 1 T perpendicular to the surface of the substrate was applied thereto.

The orientations of the c-axes of the crystals of the superconducting substance were measured by X-ray diffraction. The c-axes of 80% of the crystals were aligned with a normal to the surface of the substrate with deflection angles of 5° or below. However, the orientations of the a-axes (or the b-axes) of the crystals of the superconducting substance were not particularly aligned.

COMPARATIVE EXAMPLE 6

A layer of a superconducting substance was formed on the same commercial silver ingot as that employed in Example 1 by the same process as that employed in Example 3 to obtain a superconductor. The resistivity of the superconductor was measured by a dc four-probe resistivity measuring method to determine the superconducting critical temperature. The electrical resistance of the superconductor was zero at 83 K. The measured critical current density of the superconductor at 77 K was 9,000 A/cm$^2$ when no magnetic field was applied thereto and was 900 A/cm$^2$ when a magnetic field of 1 T perpendicular to the surface of the substrate was applied thereto.

The orientations of the c-axes of the crystals of the superconducting substance were measured by X-ray diffraction. The c-axes of 80% of the crystals were aligned with a normal to the surface of the substrate with deflection angles of 5° or below. However, the orientations of the a-axes (or the b-axes) of the crystals of the superconducting substance were not particularly aligned.

It is known from the comparative examination of the properties of Example 3 and Comparative examples 5 and 6 that a superconductor or a superconducting wire formed by combining a metallic body of a cubic aggregate structure and an oxide superconducting substance has a very large value of Jc.

EXAMPLE 4

An Ag/Au alloy block of 40% Ag content, an Ag/Au alloy block of 20% Au content, an Ag/Pd alloy block of 10% Pd content, an Ag/Cu alloy block of 10% Cu content, and an oxide dispersion-strengthened alloy block formed by dispersing 0.1 $\mu$m MgO particles in an Ag matrix in 0.1% vol. were used instead of the silver tapes of a cubic aggregate structure employed in Examples 1, 2 and 3. These blocks were rolled and heat-treated to obtain metal tapes of a cubic aggregate structure as substrates. Layers of a superconducting substance were formed on the metal tapes, respectively, by the same process as that employed in Examples 1, 2 and 3 to form superconducting tapes. The properties of these superconducting tapes were substantially the same as those of the superconductors of Examples 1, 2 and 3. Values of Jc of these superconducting tapes were 90% or below of those of the superconductors of Examples 1, 2 and 3.

EXAMPLE 5

S silver tape of a cubic aggregate structure of 5 $\mu$m in thickness, 1 cm in width and 100 m in length was made by the same process as that employed in Example 1. A layer of a superconducting substance was formed on the silver tape by the same method as that employed in Example 3 to obtain a 100 m long superconducting wire. The superconducting wire having the shape of a tape was wound of a 30 cm diameter bobbin, followed by heat treatment. The Jc of the entire length of the superconducting wire was measured. Measured Jc (all) was 50,000 A/cm$^2$ when no magnetic field was applied thereto. Jc (all) is a value obtained by dividing critical current by the sectional area of the superconducting wire including silver. Ten samples of 10 cm in length were sampled randomly from the 100 m long superconducting wire to measure the values of Jc (all) in a magnetic field, and the values of the sample pieces were measured by a dc four-probe resistivity measuring method. Measured values of Jc (all) of the sample having the worst characteristics at 77 K were 50,000, 38,000, 23,000, 11,000 and 10,000 A/cm$^2$ when no magnetic field was applied to the samples and when magnetic fields of 0.01 T, 0.1 T, 1 T and 5 T perpendicular to the longitudinal direction of the samples were applied thereto, respectively.

EXAMPLE 6

Bicrystal substrates were fabricated each by joining together two SrTiO$_3$(1 0 0) single crystal substrates with their crystal orientations [0 0 1] in parallel to each other. The bicrystal substrates differ from each other in the angle a between the respective orientations [1 0 0] of the component single crystal substrates. A layer of a superconducting substance was formed on each bicrystal substrate by the same process as that employed in Example 1 and the orientations of the crystals of the superconducting substance were measured by X-ray diffraction. It was found that not less than 98% of the orientations [0 0 1], [1 0 0] and [0 1 0] of the crystals of the superconducting substance coincided with the orientations [0 0 1], [1 0 0] and [0 1 0] of the lower $SrTiO_3$(1 0 0) single crystal substrate. Accordingly, it is known that the crystals of the superconducting substance are formed on the bicrystal substrate with the crystal orientations [1 0 0] thereof deflected at the angle (the c-axes are aligned) at positions directly above the crystal boundaries of the bicrystal substrate. Thus, it is known that samples differing from each other in the angle of the a-axis and the same in the direction of the c-axis can be obtained by depositing a superconducting substance on bicrystal substrates differing from each other in the angle .

Figure 5:
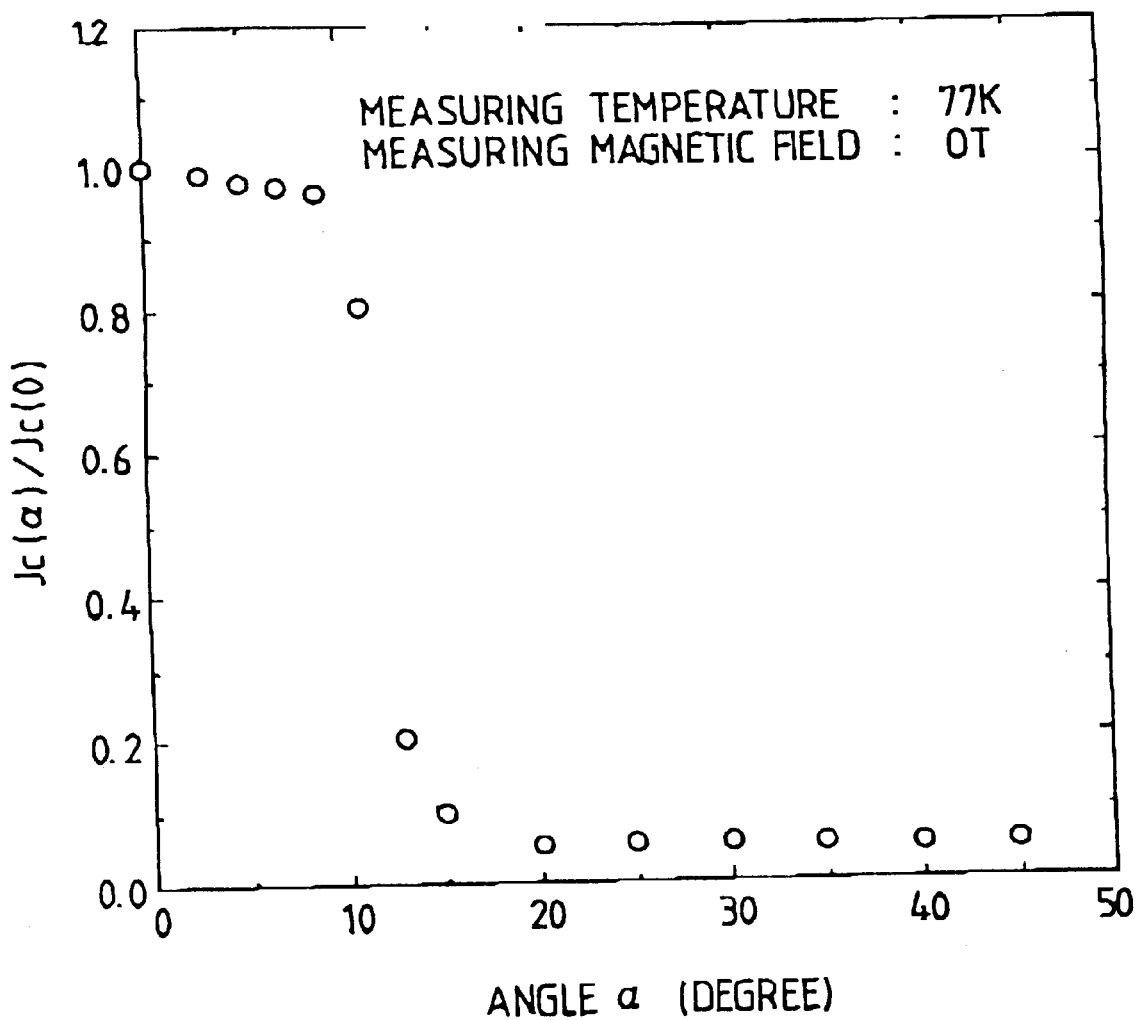
FIG. 5 is a graph showing the characteristics of a superconducting substance of $TlBa_2Ca_2Cu_3O_9$ with aligned c-axes.

FIG. 5 shows values obtained by dividing the critical current density Jc( ) of a current that flows through the crystal boundaries of crystals with their a-axes at the angle by the critical current density Jc(0) of a current that flows through the crystal boundaries of crystals with their a-axes at an angle 0 in a film of a superconducting substance of $TlBa_2Ca_2Cu_3O_9$ having aligned c-axes. As is obvious from FIG. 5, the critical current density of the current flowing across the crystal boundaries decreases sharply when the angle of the a-axes increases beyond 10°. Therefore, it is known that the a-axes of the crystals of the superconducting substance must be aligned at deflection angles of 10– or below, as well as the c-axes of the crystals to obtain a superconducting wire having satisfactory characteristics.

EXAMPLE 7

Silver tapes differing in the ratio of crystals forming a cubic aggregate structure to all the crystals were made under different rolling and heat-treating conditions, and layers of a superconducting substance were formed on the silver tapes, respectively, by the same method as that employed in Example 1 to obtain sample superconductors. The parallel crystal ratio, i.e., the ratio of silver crystals having faces {1 0 0} parallel to the surface of the silver tape and orientations <1 0 0> parallel to the rolling direction to all the silver crystals of each layer of the superconducting substance was determined by X-ray diffraction, and the critical current densities of the sample superconductors (TlBa2Ca2Cu3O9) were determined by a dc. four-probe resistivity measuring method.

Figure 6:
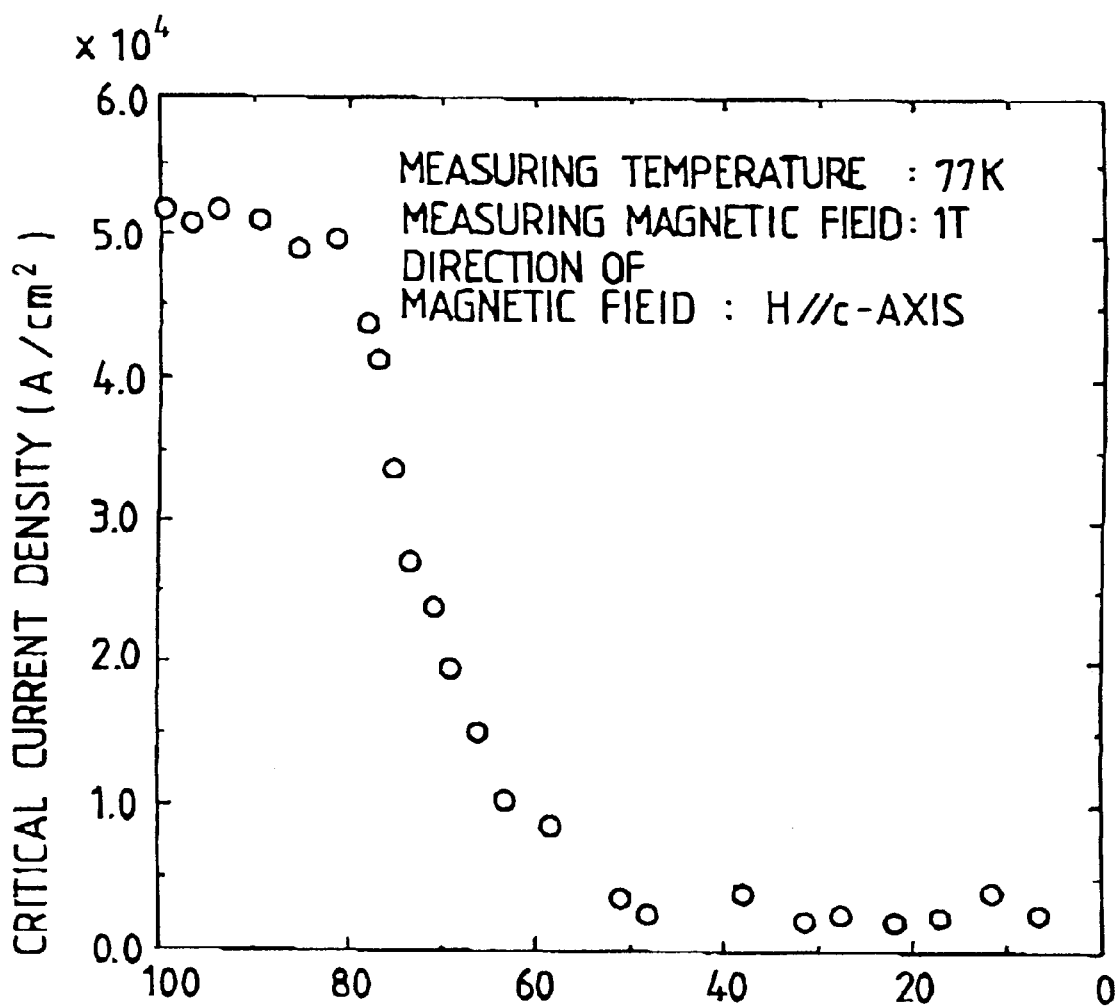
FIG. 6 is a graph showing the relation between the ratio of crystals forming a cubic aggregate structure to all the crystals of a silver tape to be used as a base material and the critical current density of a superconducting film formed on the silver tape.

As is obvious from FIG. 6 showing the variation of critical current density with the parallel crystal ratio, i.e., the ratios of the cubic aggregate structure, the critical current density in a magnetic field decreases sharply when the parallel crystal ratio decreases to or below 80%. Therefore, silver tapes having the parallel crystal ratio not less than 80% must be used to obtain superconducting wires having satisfactory characteristics.

The ratio of the superconducting crystals having orientations [1 0 0] aligned with the orientations <1 0 0> of the silver crystals forming the cubic aggregate structure at deflection angles of 10° or below estimated by X-ray diffraction was 80%.

EXAMPLE 8

Figure 7:
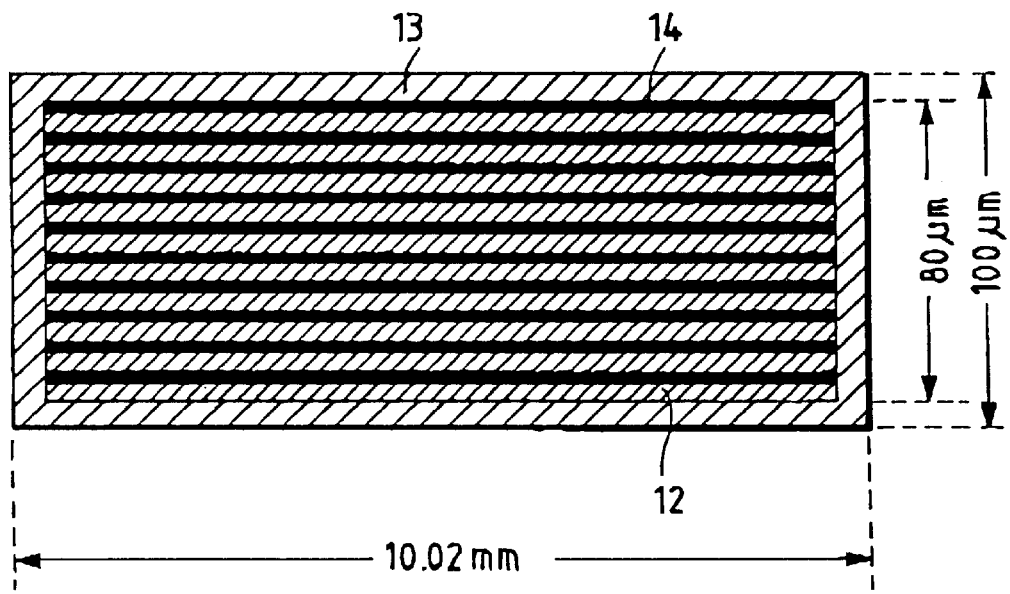
FIG. 7 is a sectional view of a 100 m long superconducting cable in accordance with the present invention.

Ten superconducting tapes, which were the same as those in Example 5, were fabricated and the ten superconducting tapes were superposed one over another to obtain a 100 m long superconducting cable shown in FIG. 7. The superconducting flat cable was coated with an about 5 $\mu$m thick alumina coating, and the alumina-coated superconducting cable was wound in a pancake-shape to obtain a superconducting coil. Eight of such a superconducting coil were made and the eight superconducting coils were stacked longitudinally to construct a superconducting magnet shown in FIG. 8. The superconducting coil was immersed in liquid nitrogen and currents were supplied to the coil to create a magnetic field. The maximum magnetic flux density of the magnetic field created by the superconducting magnet was 2.6 T.

EXAMPLE 9

Figure 8:
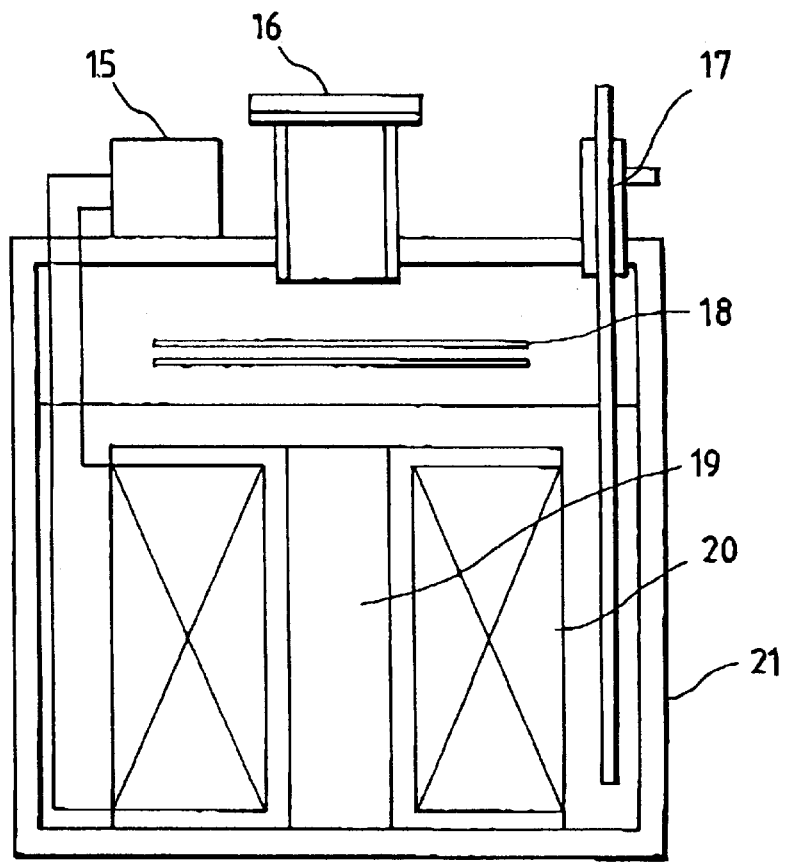
FIG. 8 is a typical view of a superconducting magnet in accordance with the present invention.
Figure 9:
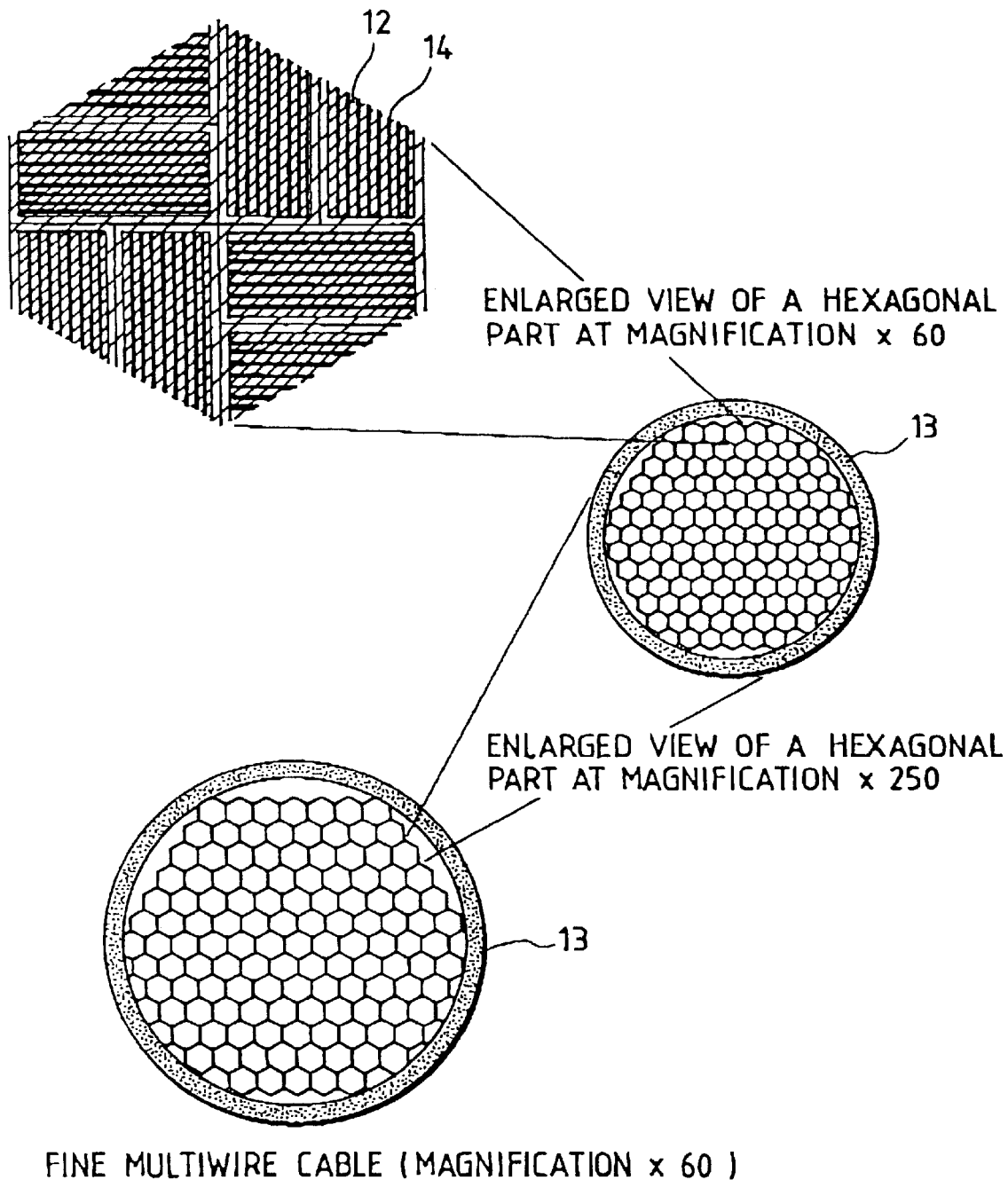
FIG. 9 is an enlarged sectional view of a superconductor in accordance with the present invention.
Figure 10:
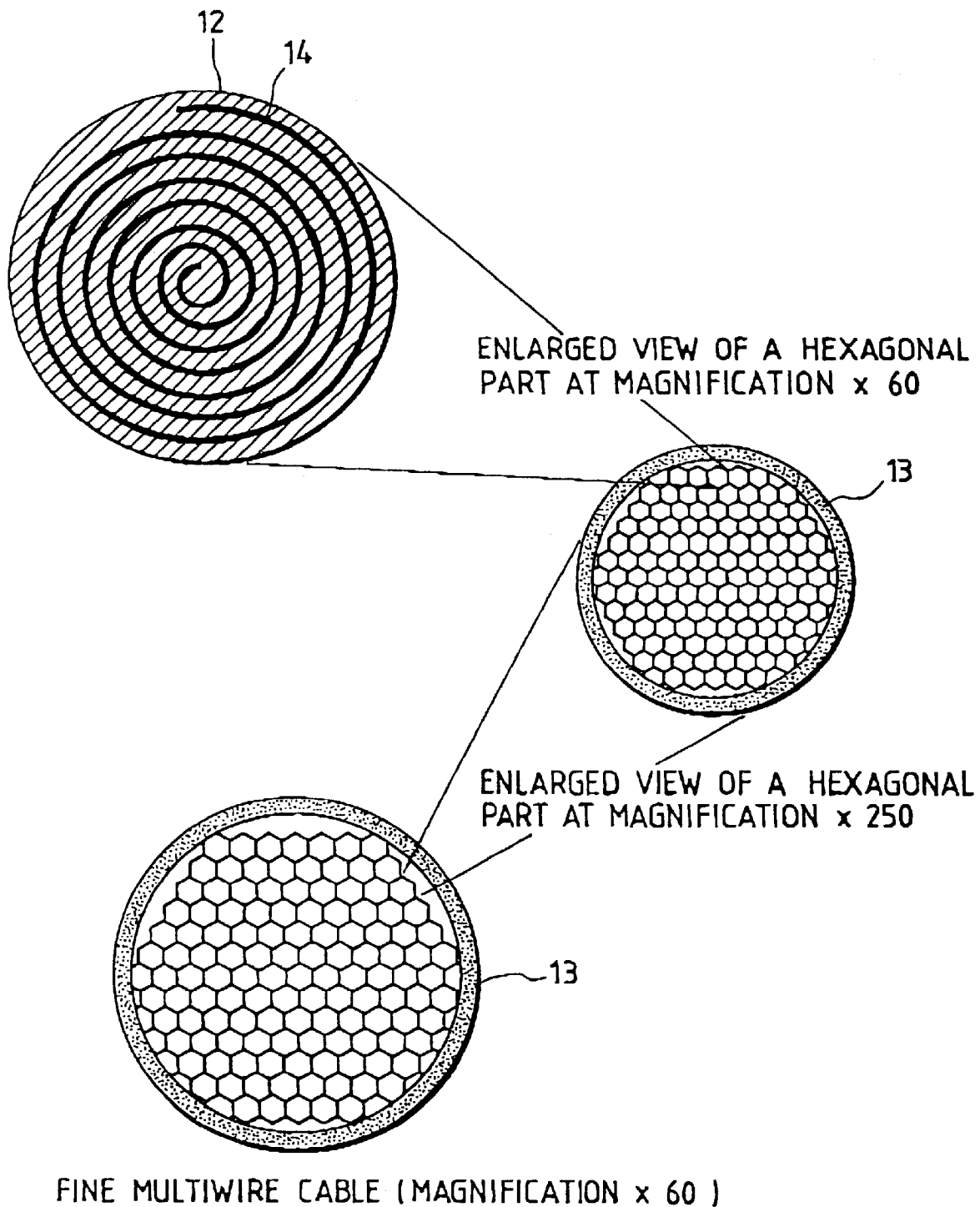
FIG. 10 is an enlarged sectional view of a superconductor in accordance with the present invention.
Figure 11:
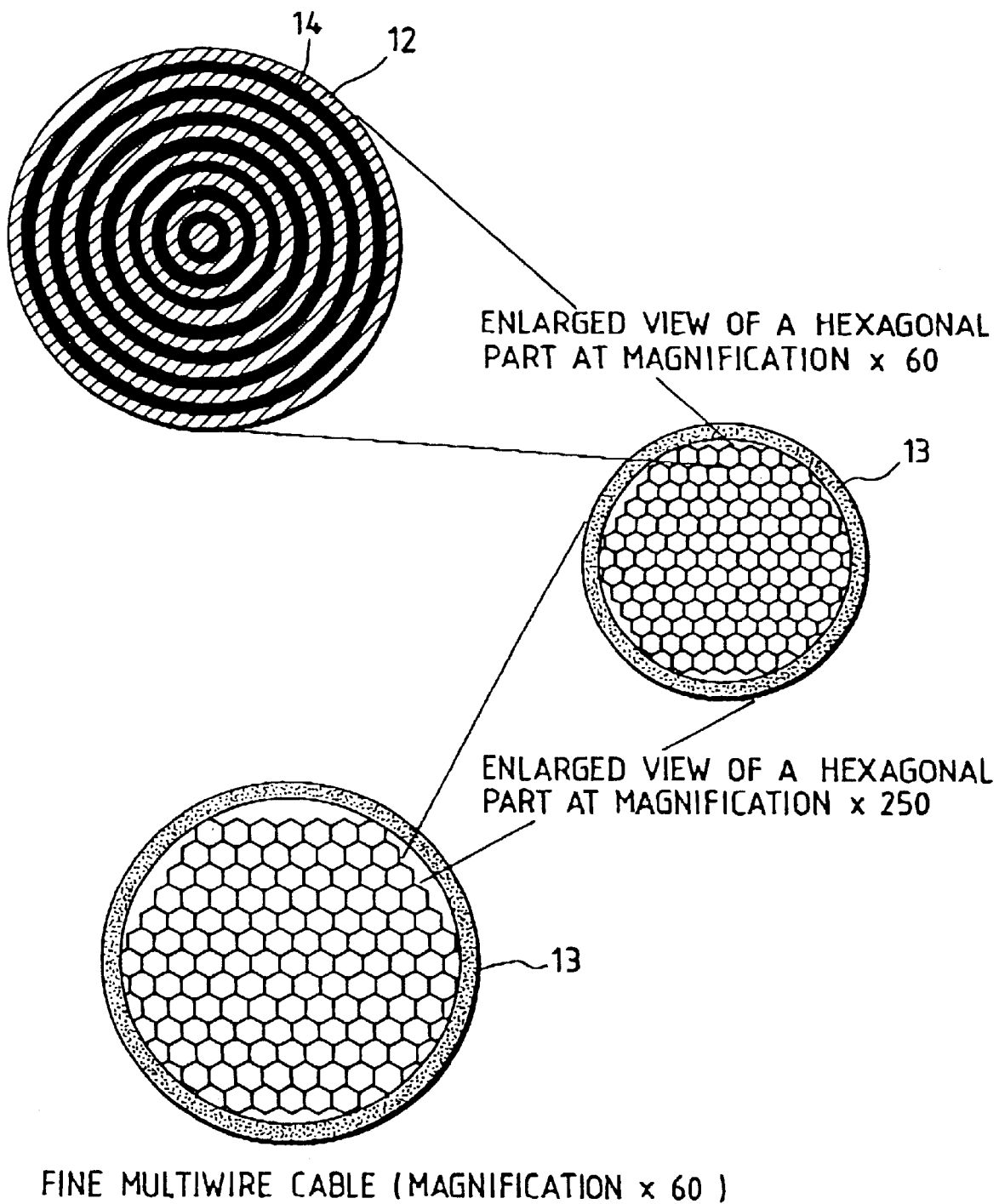
FIG. 11 is an enlarged sectional view of a superconductor in accordance with the present invention.

Superconducting cables differing from each other in sectional structure shown in FIGS. 9, 10 and 11 were fabricated by using superconducting tapes fabricated by a method similar to the method employed in Example 1. The superconducting cables were coated with an about 5 thick alumina coating. Each alumina-coated superconducting cable was wound in a pancake-shape to form a superconducting coil. Eight of each of such superconducting coils were stacked longitudinally to form a superconducting magnet as shown in FIG. 8. The coils were immersed in liquid nitrogen and currents were supplied to the coils to create magnetic fields. The maximum magnetic flux densities of the magnetic fields created by the superconducting magnets of those superconducting cables of different sectional structures were in the range of 2.1 to 2.8 T.

EXAMPLE 10

Figure 12:
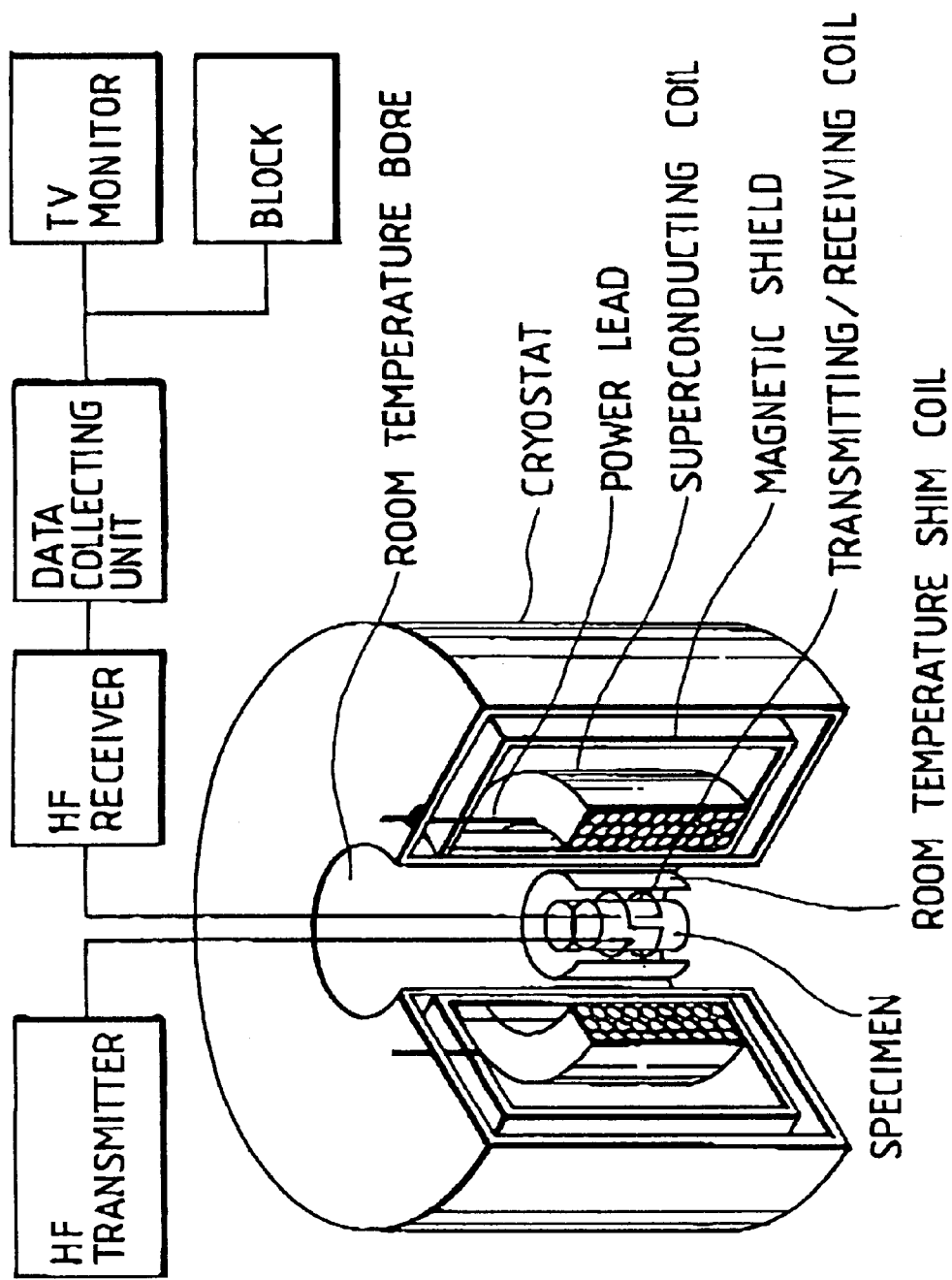
FIG. 12 is a partly sectional typical perspective view of an NMR apparatus in accordance with the present invention.

An NMR apparatus as shown in FIG. 12 was fabricated by using the superconducting magnet fabricated in Example 8. The NMR apparatus could measure the nuclear magnetic resonance of hydrogen. Since the heat insulating structure of this NMR apparatus may be simple as compared with the heat insulating structure of a commercial NMR apparatus of the helium-cooling type, the manufacturing costs of the NMR apparatus of FIG. 12 were lower than those of the commercial NMR apparatus of the helium-cooling type by 10% or above. Since the NMR apparatus does not need expensive liquid helium, the running costs of the NMR apparatus was far less than those of the NMR apparatus of the helium-cooling type.

Since an NMR apparatus and an MRI apparatus are the same in the basic principle of operation, it is possible to construct an MRI apparatus provided with a superconducting magnet formed by using the superconducting wire of the present invention. The estimated manufacturing costs of the MRI apparatus of the nitrogen-cooling type is lower than those of an MRI apparatus of the helium-cooling type by at least 20%, because the MRI apparatus of the nitrogen-cooling type needs a nitrogen refrigerator which is far simpler in construction and less expensive than a helium refrigerator, needs a single-layer insulator, operates at an operating temperature of 77 K, which is far higher than the operating temperature of 4.2 K of the MRI apparatus of the helium-cooling type, and the MRI apparatus of the nitrogen-cooling type needs no means for preventing quenching because the specific heat of the superconducting wire is increased by about 100.

EXAMPLE 11

A magnetic shield employing a superconductor in accordance with the present invention was fabricated. A cubic shell was fabricated of 3 cm thick superconducting plates, the cubic shell was cooled in liquid nitrogen at 78 K to create a superconducting shielding state, and an external magnetic field of 50 G was applied to the cubic shell, and magnetic flux density within the cubic shell was measured with a Hall element disposed within the cubic shell. The magnetic flux density of the internal magnetic field was below the lower limit of magnetic flux density detectable by the Hall element. When an external magnetic field of 3,000 G was applied to the cubic shell, the magnetic flux density of the internal magnetic field was about 1 G. The measurement of the internal magnetic field proved that the magnetic shielding performance of the magnetic shield employing the superconductor in accordance with the present invention is satisfactory.

EXAMPLE 12

An estimate was made of the reduction of the costs of a particle beam converging four-pole electromagnet of the nitrogen-cooling type employing a superconducting wire in accordance with the present invention to be used on a large particle accelerator, such as an accelerating ring of 1 km in diameter, relative to the costs of a superconducting magnet of the helium-cooling type. Then, it was found that the costs of the four-pole electromagnet of the nitrogen-cooling type are lower than those of the conventional superconducting magnet of the helium-cooling type by 20% or above, because the former needs a nitrogen refrigerator which is far simpler in construction and less expensive than a helium refrigerator and needs a simple heat insulating means and a very simple refrigerant supply system for supplying liquid nitrogen to the superconducting magnet because liquid nitrogen has a large specific heat.

EXAMPLE 13

The performance of a superconductor employing $(Tl_{X1}Pb_{X2}Bi_{X3}Hg_{X4}Cu_{X5})(Sr_{1-X6}Ba_{X6})_2Ca_{n-1}Cu_nO_{2n+3+X7}$, where $0 \leq X1 \leq 1.0$, $0 \leq X2 \leq 1.0$, $0 \leq X3 \leq 0.5$, $0 \leq X4 \leq 1.0$, $0 \leq X5 \leq 1.0$, $0.5 \leq X1+X2+X3+X4+X5 \leq 1$, $0 \leq X6 \leq 1$, $-0.5 \leq X7 \leq 0.5$ and n=1, 2, 3, 4 or 5, was the same as that of the superconductors of Examples 1 to 9.

EXAMPLE 14

The performance of a superconductor employing $LnBa_2Cu_3O_{7+X1}$, where Ln is Y or a rare earth element and $-0.5 \leq X1 \leq 0.1$, is substantially the same as that of the superconductors of Examples 1 to 9, provided that the angle of the a-axes of the crystals of the superconducting substance must be 6° or below.

EXAMPLE 15

The critical current density of a superconductor employing:
$(Tl_{1-X1-X2-X3}Pb_{X1}Bi_{X2}Hg_{X3})_2(Sr_{1-X4}Ba_{X4})_2Ca_{n-1}Cu_nO_{2n+3+X5}$; where n+2, 3, 4, 5 or 6, $0 \leq X1 \leq 0.8$, $0 \leq X2 \leq 0.5$, $0 \leq X3 \leq 1.0$, $0 \leq X1+X2+X3 \leq 1$, $0 \leq X4 \leq 1$, and $0.5 \leq X5 \leq 0.5$, was about twice as large as that of the conventional superconducting wire or superconductor.

EXAMPLE 16

The critical current density of a superconductor employing $(Bi_{1-X1}Pb_{X1})_2Sr_2Ca_{n-1}Cu_nO_{2n+4}$, where $0 \leq X1 \leq 0.4$ and n=1, 2 or 3, was about twice as large as that of the conventional superconducting wire or superconductor.

EXAMPLE 17

Figure 13:
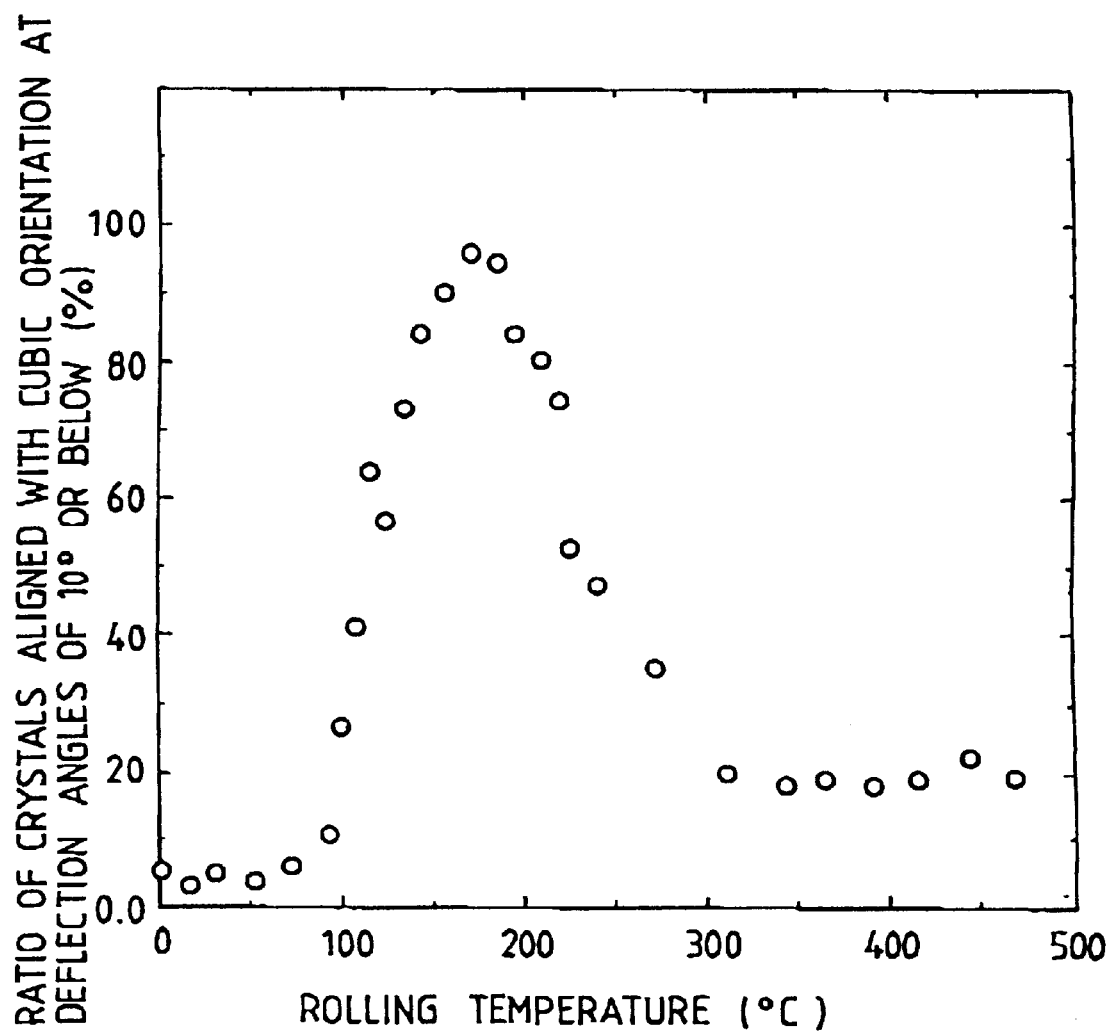
FIG. 13 is a graph of assistance in explaining Example 17, showing the variation of the ratio of crystals forming a cubic aggregate structure to all the crystals in a rolled silver sheet with rolling temparture.

A 99.99% purity 3 mm thick silver plates were rolled at different temperatures into 0.1 mm thick silver sheets, and the silver sheets were annealed at 800° C. for ten hours. The silver sheets were examined to find the ratio of crystals having faces {1 0 0} parallel to the surface of the sheet and orientations <1 0 0> parallel to the rolling direction at deflection angles of 10° or below to all the crystals. The results of examination are shown in FIG. 13. As is obvious from FIG. 13, a rolling temperature suitable for forming a cubic aggregate structure is in the range of 100 to 300° C., more preferably, in the range of 150 to 200° C.

EXAMPLE 18

Figure 14:
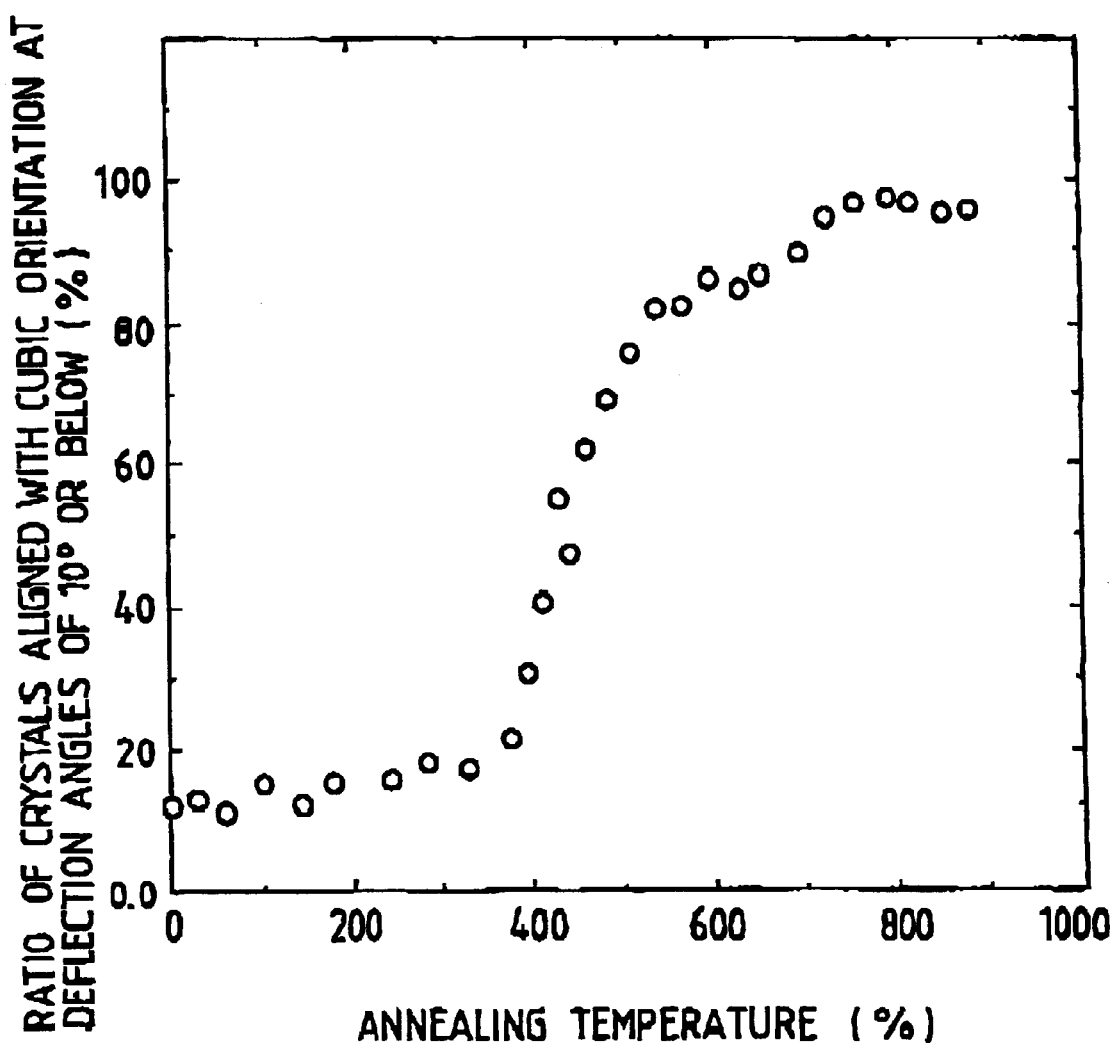
FIG. 14 is a graph of assistance in explaining Example 18, showing the variation of the ratio of crystals forming a cubic aggregate structure to all the crystals in a rolled silver sheet with annealing temperature.

A 99.99% purity 3 mm thick silver plates were rolled at 160° C. into 0.1 mm thick silver sheets, and the silver sheets were annealed at different temperatures, respectively, for ten hours. The silver sheets were examined to find the ratio of crystals having faces {1 0 0} parallel to the surface of the sheet and orientations <1 0 0> parallel to the rolling direction at deflection angles of 10° or below to all the crystals. The results of examination are shown in FIG. 14. As is obvious from FIG. 14, an annealing temperature suitable for forming a cubic aggregate structure is in the range of 400° C. to the melting point of silver.

The present invention provides superconductors, superconducting wires., superconducting magnets and superconducting apparatuses, having a high superconducting critical current density in a high magnetic field, to operate when cooled in liquid nitrogen as well as in liquid helium. Since the superconducting apparatuses employing superconductors or superconducting wires in accordance with the present invention are able to operate when cooled in liquid nitrogen, not only substituting conventional superconductors or superconducting wires for superconducting parts, but the cooling system, the heat insulating structure and the quenching preventing measures, i.e., measures to prevent the sudden breakage of superconduction, of superconducting systems including such superconducting apparatuses are simplified, and the superconducting apparatus employing superconductors or superconducting wires in accordance with the present invention reduces the costs of the superconducting system effectively.

What is claimed is:

1. A superconducting wire comprising:
    a substrate and an oxide superconducting substance on said substrate,
    said substrate comprises a metallic body being of polycrystal,
    crystals of the superconducting substance are oriented by influence of crystals of said metallic body at an interface between said substrate and said oxide superconducting substance,
    not less than 60% of the faces {100} of the crystals of the metallic body are parallel to the interface at deflection angles of 10° or below,
    not less than 60% of directions <100> of the crystals of the metallic body are aligned with each other at deflection angles of 10° or below,
    not less than 60% of the faces (100) of the crystals of the superconducting substance are parallel to the face {100} of the crystals of the metallic body at deflection angles of 10° or below, and
    not less than 60% of the directions [100] of the crystals of the superconducting substance are parallel to the directions <100> of the crystals of the metallic body at deflection angles of 10° or below.

2. The superconducting wire according to claim 1, wherein said metallic body and said oxide superconducting substance are in direct contact with each other at said interface.

3. A superconducting wire comprising at least a metallic body being of polycrystal and
- an oxide superconducting substance on said metallic body,
- said metallic body and said oxide superconducting substance being in direct contact with each other,
- at least part of said metallic body has a cubic aggregate structure,
- said metallic body comprises a metal selected from the group consisting of FCC and BCC metals;
- not less than 60% of the faces {100} of the crystals of the metallic body are parallel to an interface between said metallic body and said oxide superconducting substance at deflection angles of 10° or below,
- not less than 60% of the directions <100> of the crystals of the metallic body are aligned with each other at deflection angles of 10° or below,
- not less than 60% of the faces (100) of the crystals of the superconducting substance are parallel to the face {100} of the crystals of the metallic body at deflection angles of 10° or below,
- not less than 60% of the directions [110] of the crystals of the superconducting substance are parallel to the directions <110> of the crystals of the metallic body at deflection angles of 10° or below.

4. A superconducting wire according to claim 3, wherein
- not less than 80% of the faces {100} of the crystals of the metallic body are parallel to said interface at deflection angles of 10° or below, and
- not less than 80% of the directions <100> of the crystals of the metallic body are aligned with each other at deflection angles of 10° or below.

5. A superconducting wire according to claim 3, wherein,
- said metallic body is formed in a tubular shape, and
- not less than 60% of direction <100> of the crystals of the metallic body are aligned with the longitudinal direction of the tubular shaped metallic body at deflection angles of 10° or below.

6. A superconducting wire according to claim 3, wherein
- said metallic body is a metal tape, and
- not less than 60% of the directions <100> of the crystals of the metallic body are aligned with the longitudinal direction of said metal tape at deflection angles of 10° or below.

7. A superconducting wire according to claim 3, wherein
- the ratio of the sectional area S1 of said metallic body and the sectional area S2 of said oxide superconducting substance each in a section perpendicular to the interface is S2/S1>=0.01.

8. A superconducting wire according to claim 3, wherein said metallic body comprises silver.

9. A super conducting wire according to claim 3, wherein said metallic body comprises an alloy containing silver, silver containing an oxide dispersed therein, an alloy containing silver and an oxide dispersed therein or an alloy containing silver and an intermetallic compound dispersed therein.

10. A superconducting wire according to claim 3, wherein said metallic body has an FCC structure.

11. A superconducting wire according to claim 3, wherein said metallic body has an BCC structure.

12. A superconducting wire according to claim 3, wherein the chemical composition of said oxide superconducting substance is represented by:

$$(Tl_{X1}Pb_{X2}Bi_{X3}Hg_{X4}Cu_{X5})(Sr_{1-X6}Ba_{X6})_2Ca_{n-1}Cu_nO_{2n+3+X7};$$

where
- $0 \leq X1 \leq 1.0$,
- $0 \leq X2 \leq 1.0$,
- $0 \leq X3 \leq 0.5$,
- $0 \leq X4 \leq 1.0$,
- $0 \leq X5 \leq 1.0$,
- $0.5 \leq X1+X2+X3+X4+X5 \leq 1$,
- $0 \leq X6 \leq 1$,
- $-0.5 \leq X7 \leq 0.5$, and
- n=1, 2, 3, 4 or 5.

13. A superconducting wire according to claim 3, wherein the chemical composition of said oxide superconducting substance is represented by:

$$(Tl_{1-X1-X2-X3}Pb_{X1}Bi_{X2}Hg_{X3})_2(Sr_{X4}Ba_{X4})_2Ca_{n-1}Cu_nO_{2n+4+X5};$$

where
- $0 \leq X1 \leq 0.9$,
- $0 \leq X2 \leq 0.1$,
- $0 \leq X3 \leq 0.5$,
- $0 \leq X1+X2+X3 \leq 1$,
- $0 \leq X4 \leq 1$,
- $-0.5 \leq X5 \leq 0.5$, and
- n=1, 2, 3, 4 or 5.

14. A superconducting wire according to claim 3, wherein the chemical composition of said oxide superconducting substance is represented by:

$$(Bi_{1-X1}Pb_{X1})_2Sr_2Ca_{n-1}Cu_nO_{2n+4+X2};$$

where
- $0 \leq X1 \leq 0.4$,
- $-0.5 \leq X2 \leq 0.5$, and
- n=1, 2, or 3.

15. A superconducting wire according to claim 3, wherein the chemical composition of said oxide superconducting substance is represented by:
- $LnBa_2Cu_3O_{7+X1}$; where Ln is Y or one or a plurality of rare earth elements, and $-0.5 \leq X1 \leq 0.2$.

16. A superconducting magnet employing said superconducting wire of claim 3.

17. An NMR apparatus provided with a magnet employing said superconducting wire of claim 3.

18. A synchrotron radiation generator provided with a magnet employing the superconducting wire of claim 3.

19. A magnetic separator provided with a magnet employing the superconducting wire of claim 3.

20. A superconducting wire according to claim 3, wherein
- said metallic body is a silver tape,
- said silver tape having a purity of 99.0% or above and at least 80% of silver crystals form a cubic texture,
- the faces {100} of said silver crystals are parallel to the surface of the silver tape, and
- the directions <100> of said silver crystals are aligned with the rolling direction.

21. A superconducting wire according to claim 20, wherein an a-axes or a b-axes of not less than 80% of the crystals of the superconducting substance are aligned with the rolling direction of said silver tape.

22. A superconducting cable employing a plurality of said superconducting wires of claim 3, wherein said superconducting wires are superposed one over another.

23. The superconducting cable of claim 22, further comprising an alumina coating over said cable.

24. A coil employing said superconducting cable of claim 23, wherein said superconducting cable is wound in a coil configuration.

25. A magnet comprising a plurality of said coils as defined by claim 24.

* * * * *

UNITED STATES PATENT AND TRADEMARK OFFICE
CERTIFICATE OF CORRECTION

PATENT NO. : 6,316,391 B1
DATED : November 13, 2001
INVENTOR(S) : Toshiya Doi et al.

It is certified that error appears in the above-identified patent and that said Letters Patent is hereby corrected as shown below:

Title page,
Item [56], OTHER PUBLICATIONS, change "Shyugo soshiki" to -- Shyugo Soshiki --; change "$T1_1$" to -- T1-1 --; change "Uniaxialy" to -- Uniaxially --; change "T11" to -- T1-1 --.
Item [57], ABSTRACT,
Line 13, change "super conducting" to -- superconducting --.

Column 3,
Line 9, after "Maruzen)" insert -- . --.

Column 6,
Line 9, change "is" to -- are --.

Column 7,
Line 21, after "went" insert -- a --.
Line 23, after "goes" insert -- to the --.
Lines 30 and 48, change "is" to -- are --.

Column 8,
Line 28, change "temparture" to -- temperature --.

Column 9,
Line 41, change "superconducting" to -- superconducting --.
Line 48, delete "of ten and odd percent" and insert -- from 10% --.
Line 54, after "invention" insert -- provided that the crystal structures thereof are basically the same as those of the substances in accordance with the present invention. --.

Column 10,
Line 32, change "litter" to -- liter --.

Column 11,
Line 57, change "litter" to -- liter --.

Column 13,
Line 4, change "litter" to -- liter --.

UNITED STATES PATENT AND TRADEMARK OFFICE
CERTIFICATE OF CORRECTION

PATENT NO.   : 6,316,391 B1
DATED        : November 13, 2001
INVENTOR(S)  : Toshiya Doi et al.

It is certified that error appears in the above-identified patent and that said Letters Patent is hereby corrected as shown below:

Column 15,
Lines 7 and 13, after "angle" insert -- $\alpha$ --.
Line 15, change "Jc ( )" to -- Jc ($\alpha$) --.
Line 42, change "dc." to -- dc --.

Column 17,
Line 66, delete "A".

Column 18,
Line 11, delete "A".
Line 23, change "wires.," to -- wires, --.

Signed and Sealed this

Sixteenth Day of September, 2003

JAMES E. ROGAN
*Director of the United States Patent and Trademark Office*